(12) United States Patent
Liaw

(10) Patent No.: US 11,742,347 B2
(45) Date of Patent: Aug. 29, 2023

(54) FIN END ISOLATION STRUCTURE FOR SEMICONDUCTOR DEVICES

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 327 days.

(21) Appl. No.: 16/944,381

(22) Filed: Jul. 31, 2020

(65) Prior Publication Data

US 2022/0037314 A1 Feb. 3, 2022

(51) Int. Cl.
*H01L 27/088* (2006.01)
*H01L 21/8234* (2006.01)
*H01L 29/06* (2006.01)
*H01L 29/66* (2006.01)
*H01L 29/78* (2006.01)
*H10B 10/00* (2023.01)

(52) U.S. Cl.
CPC .. *H01L 27/0886* (2013.01); *H01L 21/823431* (2013.01); *H01L 21/823481* (2013.01); *H01L 29/0653* (2013.01); *H01L 29/66795* (2013.01); *H01L 29/7851* (2013.01); *H10B 10/12* (2023.02)

(58) Field of Classification Search
CPC ......... H01L 27/0886; H01L 21/823431; H01L 21/823481; H01L 27/1104; H01L 29/0653; H01L 29/66795; H01L 29/7851
See application file for complete search history.

(56) References Cited

U.S. PATENT DOCUMENTS

| 8,847,361 | B2 | 9/2014 | Liaw |
| 9,362,290 | B2 | 6/2016 | Liaw |
| 9,613,953 | B2 | 4/2017 | Liaw |

(Continued)

FOREIGN PATENT DOCUMENTS

CN 107222200 A * 9/2017 ............. H03K 19/20

OTHER PUBLICATIONS

Vladimir Stejskal, Jiri Slezak, On LOD Effect, Mar. 2016, 20 pages.

*Primary Examiner* — Peter Bradford
(74) *Attorney, Agent, or Firm* — Haynes and Boone, LLP

(57) ABSTRACT

A semiconductor structure includes a substrate, and first and second semiconductor fins extending from the substrate and lengthwise aligned along a first direction. The semiconductor structure further includes an isolation structure over the substrate and adjacent to sidewalls of the semiconductor fins, and first and second gate structures oriented lengthwise along a second direction generally perpendicular to the first direction. The first and the second gate structures are disposed over the isolation structure. The first gate structure is disposed over the first semiconductor fin. The second gate structure is disposed over the second semiconductor fin. The semiconductor structure further includes a spacer layer that is disposed on a sidewall of the first gate structure and on a sidewall of the second gate structure and extends continuously through a trench between an end of the first semiconductor fin and an end of the second semiconductor fin.

20 Claims, 34 Drawing Sheets

(56) References Cited

U.S. PATENT DOCUMENTS

| | | |
|---|---|---|
| 9,793,273 B2 | 10/2017 | Liaw |
| 9,805,985 B2 | 10/2017 | Liaw |
| 9,941,173 B2 | 4/2018 | Liaw |
| 10,170,480 B2 | 1/2019 | Liaw |
| 2011/0195564 A1* | 8/2011 | Liaw .................. H01L 21/3065 257/E21.294 |
| 2016/0020210 A1* | 1/2016 | Liaw ................. H01L 21/30604 257/369 |
| 2016/0284695 A1* | 9/2016 | Liaw ............... H01L 21/823437 |
| 2017/0025540 A1* | 1/2017 | Liou ..................... H01L 29/785 |
| 2017/0054024 A1* | 2/2017 | Doris ............... H01L 21/30604 |
| 2019/0259670 A1* | 8/2019 | Zhuang ........... H01L 21/823878 |
| 2020/0020782 A1* | 1/2020 | Ching ................ H01L 21/76224 |
| 2020/0075399 A1* | 3/2020 | Kim .................. H01L 21/76224 |
| 2022/0051945 A1* | 2/2022 | More ............. H01L 21/823418 |

* cited by examiner

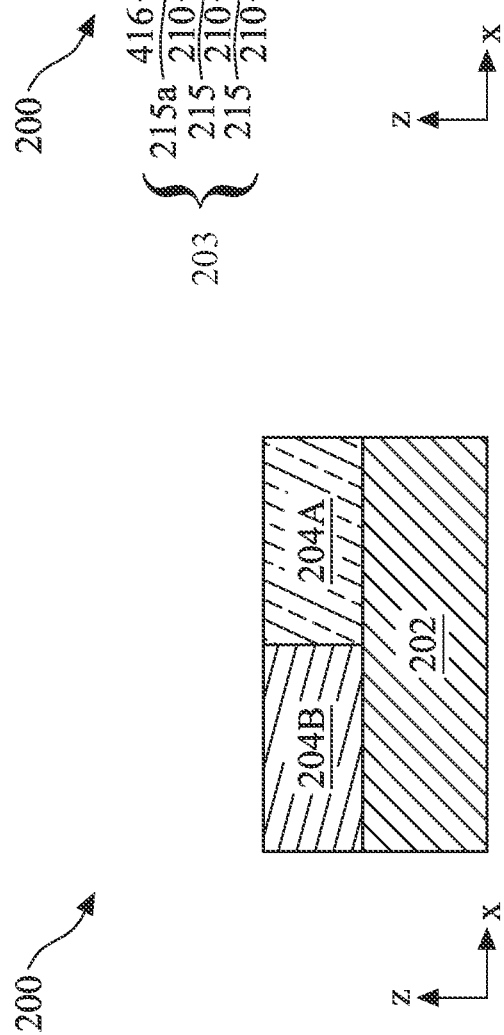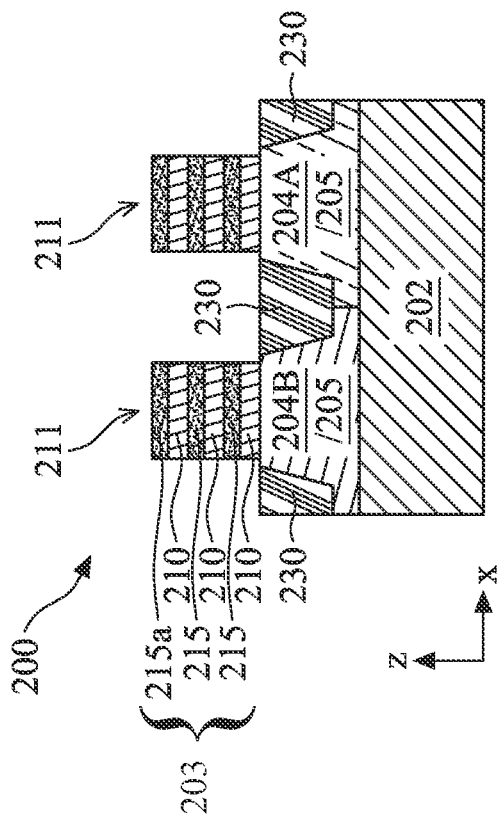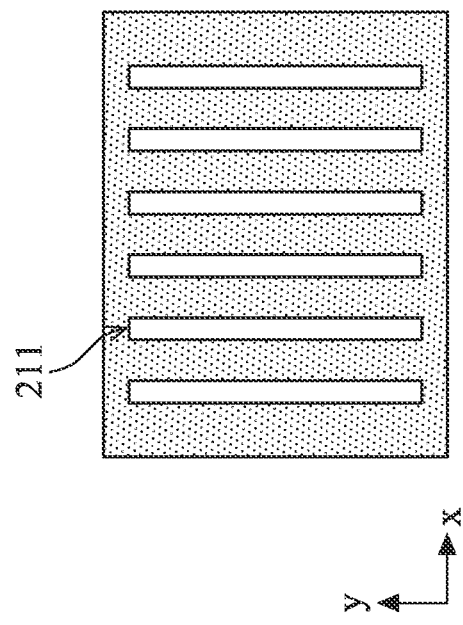

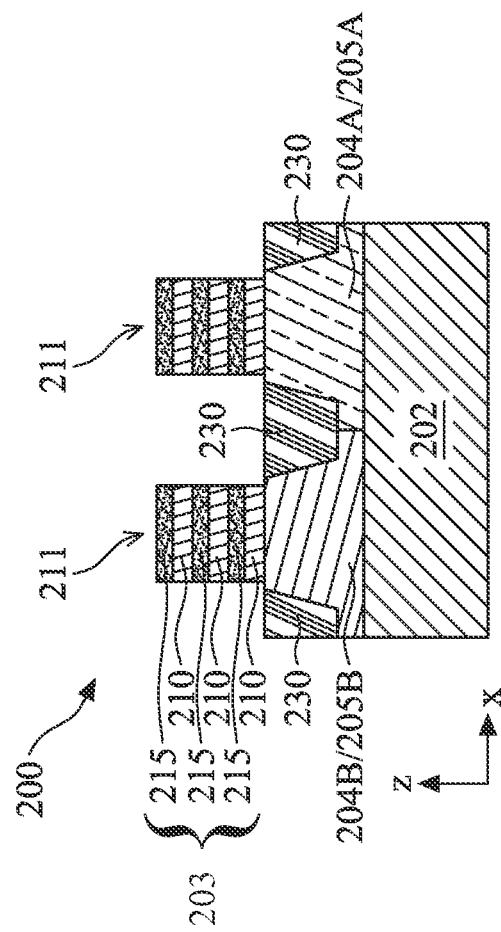
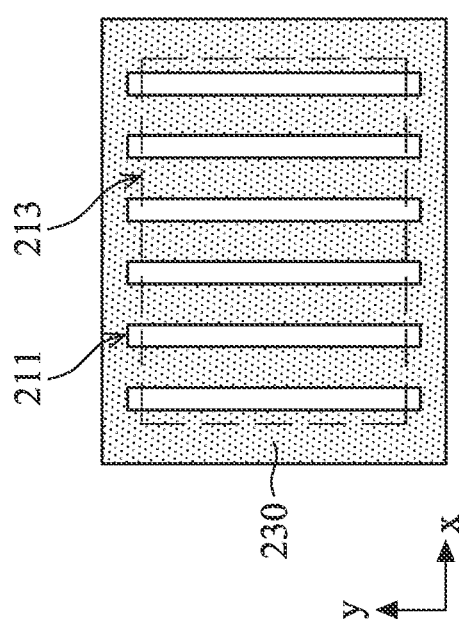
FIG. 7B
FIG. 7A

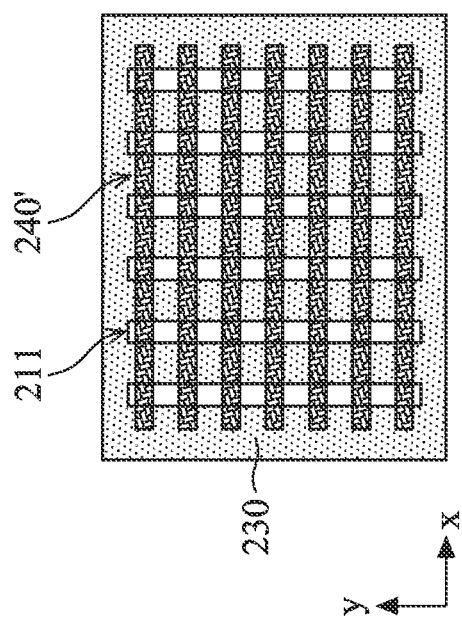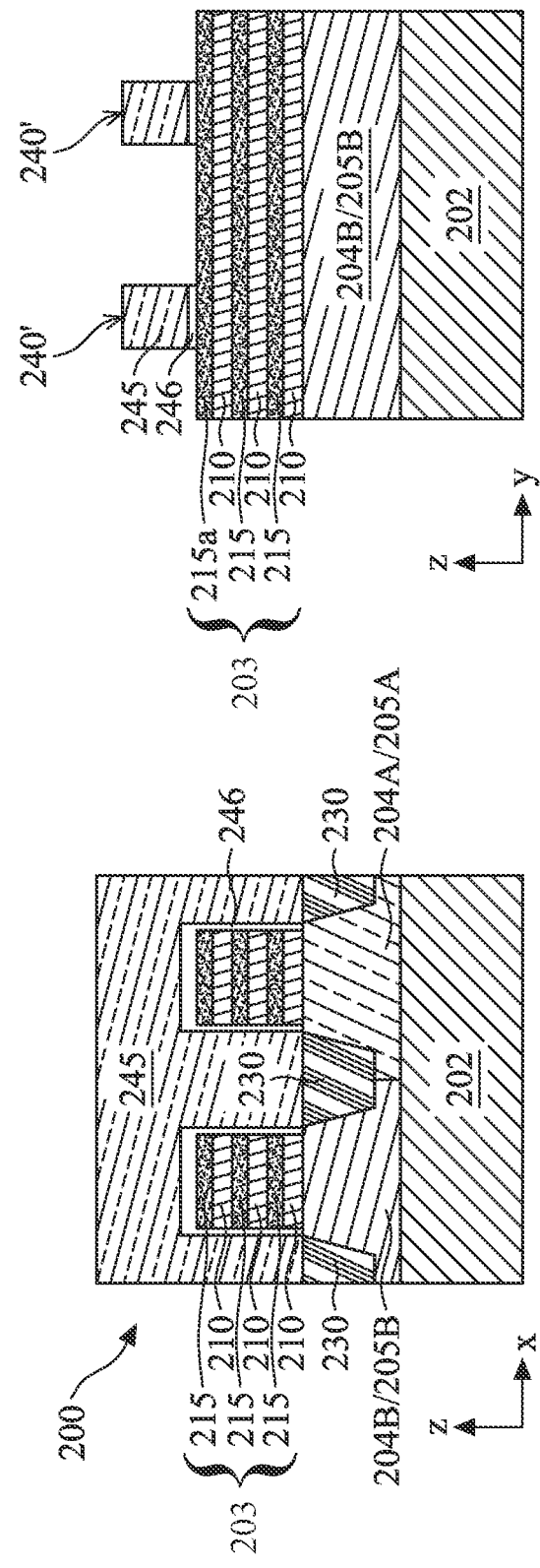
FIG. 8A
FIG. 8B
FIG. 8C

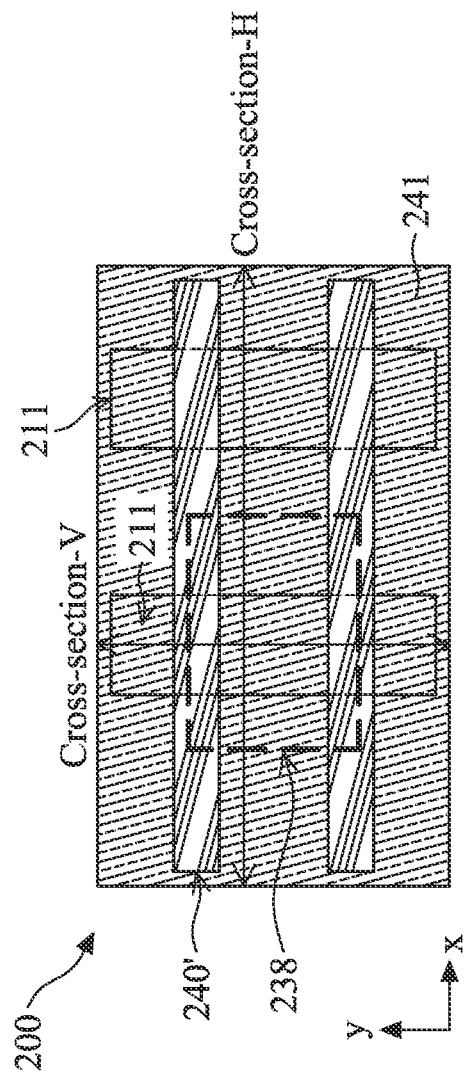
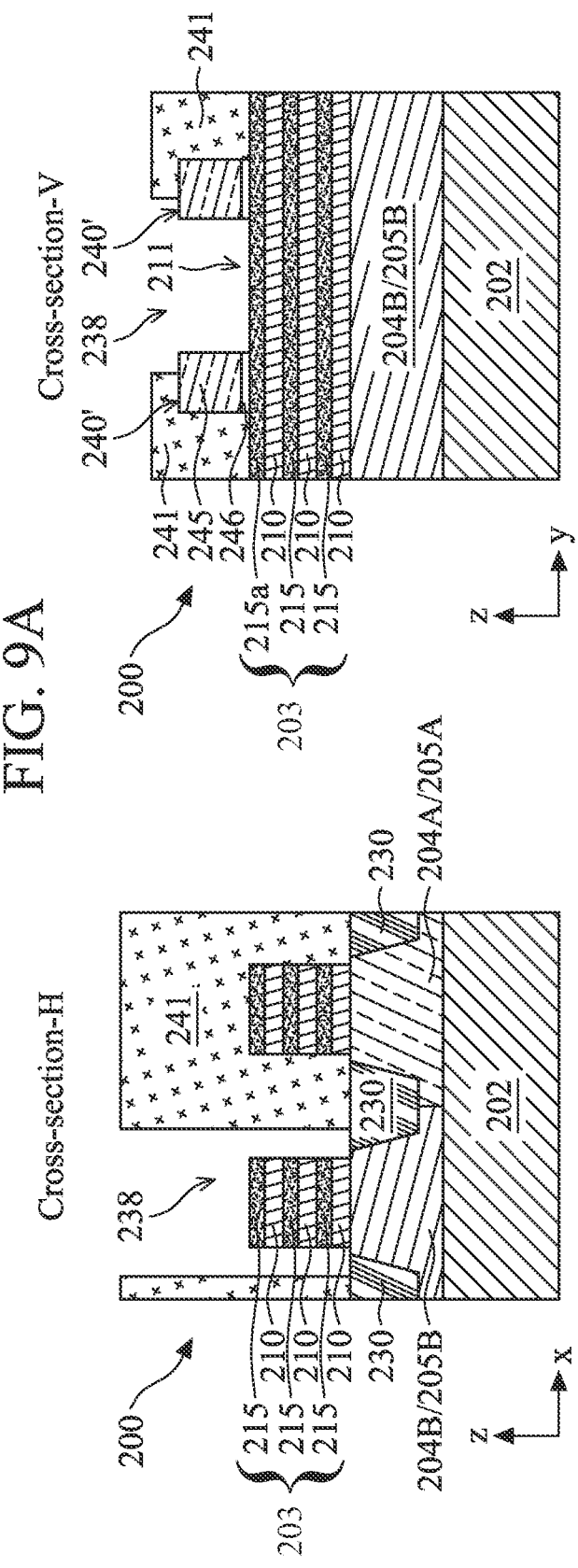
FIG. 9A
FIG. 9B
FIG. 9C

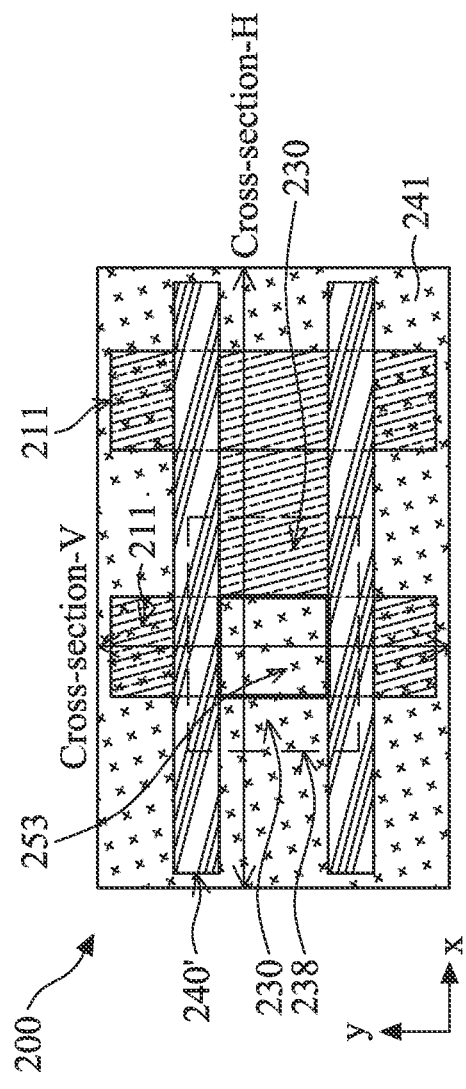
FIG. 10A
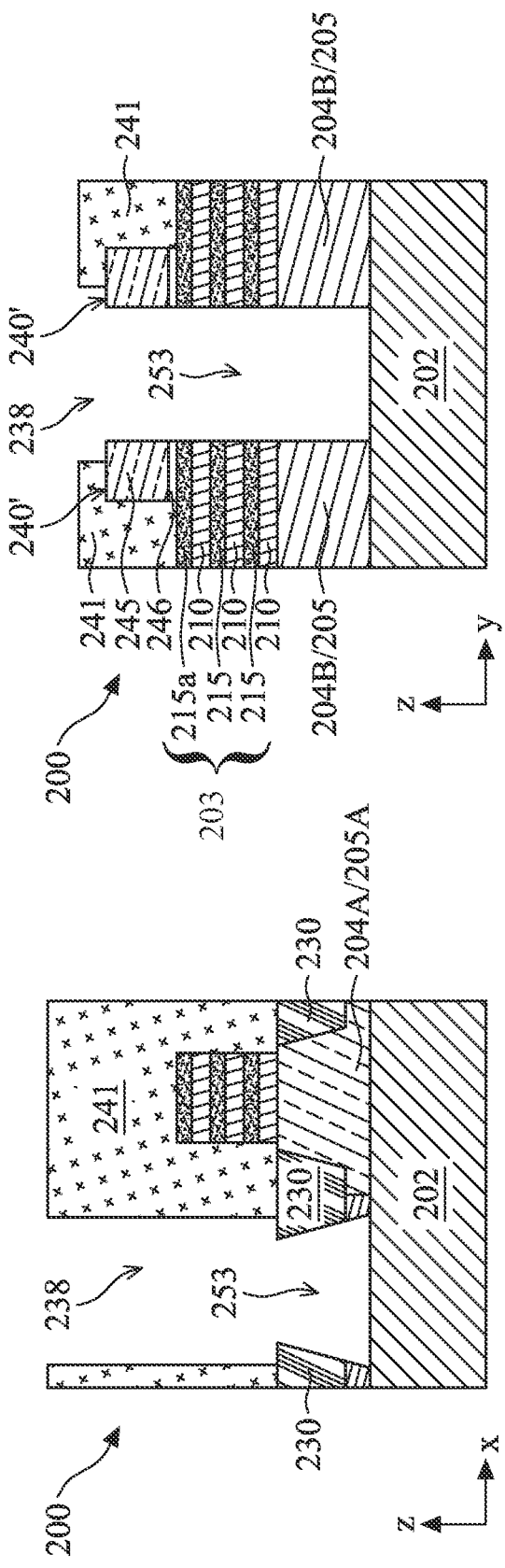
FIG. 10C
FIG. 10B

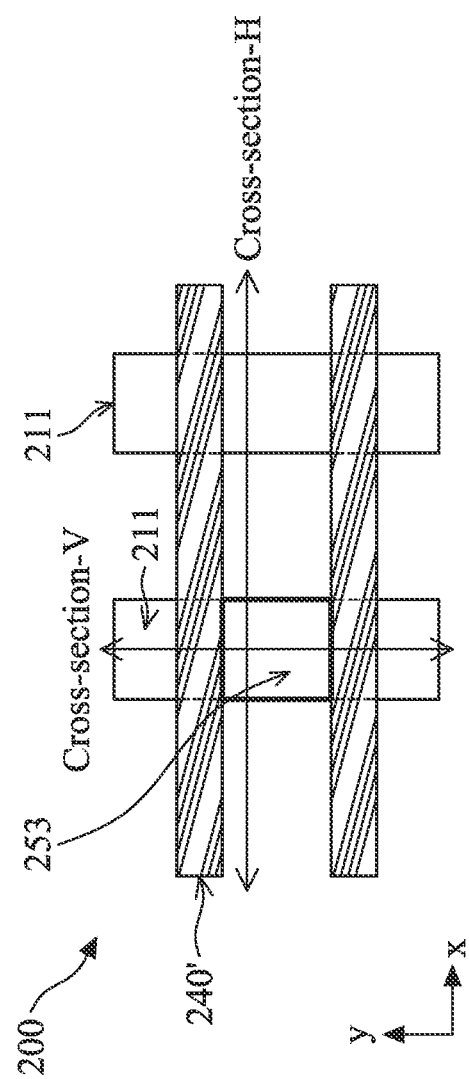
FIG. 11A
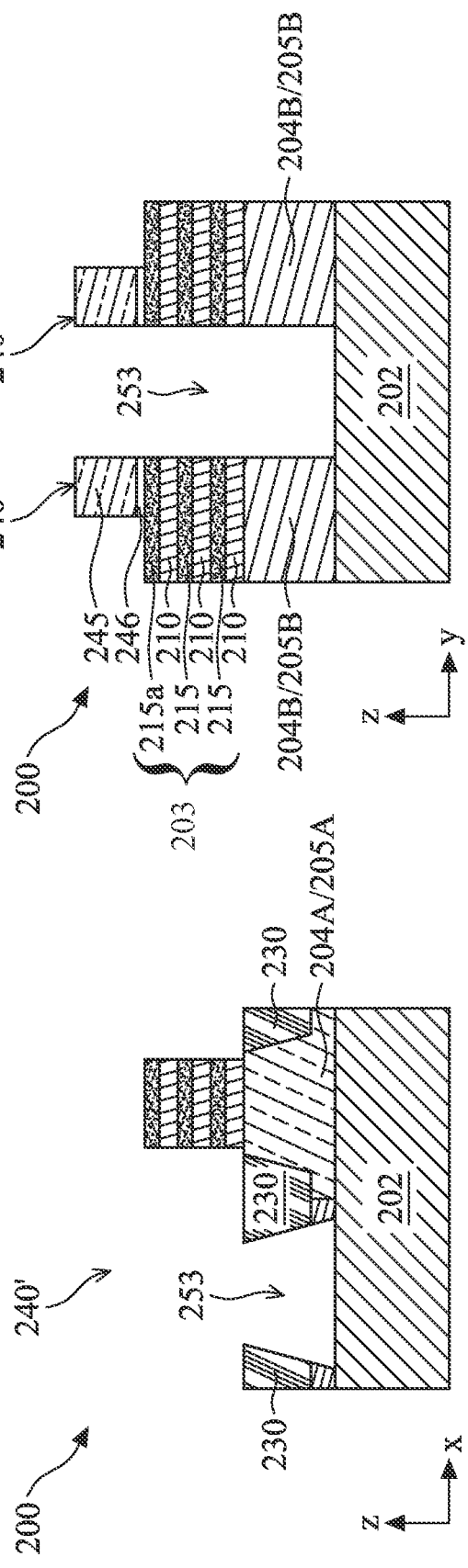
FIG. 11C
FIG. 11B

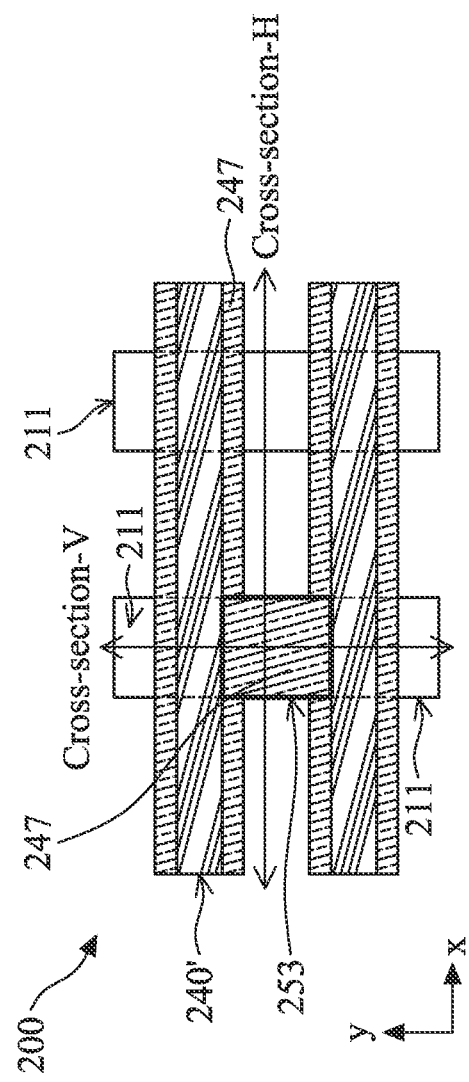
FIG. 12A
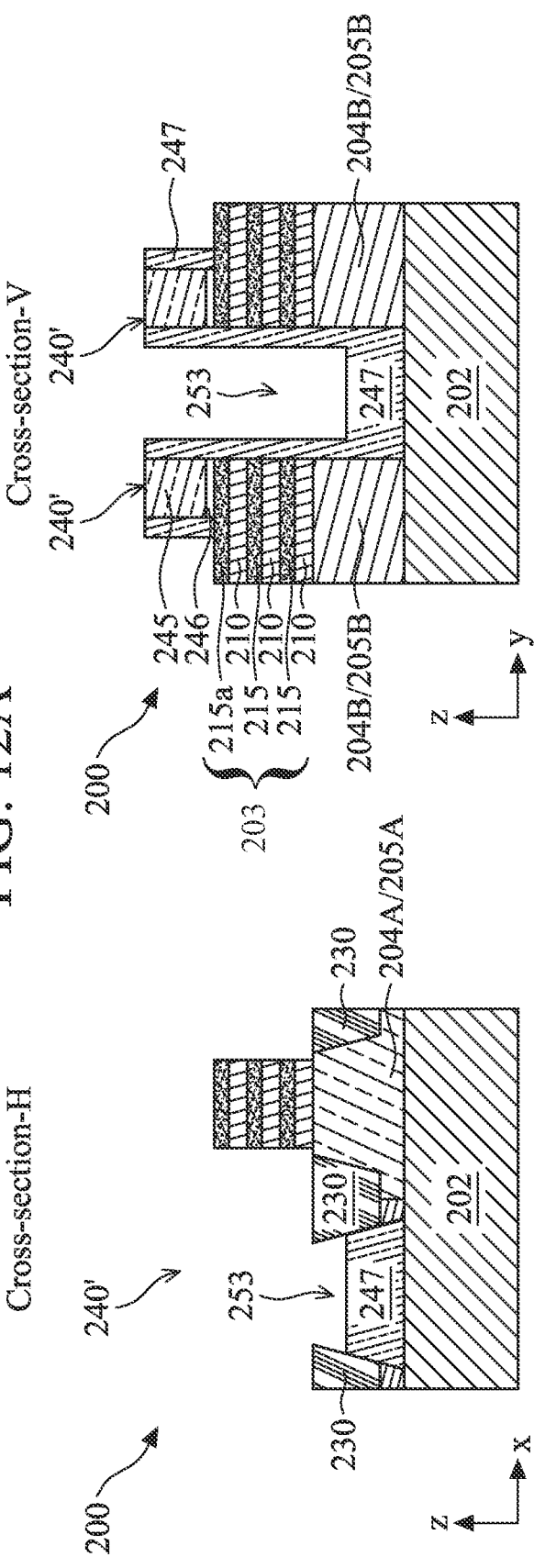
FIG. 12B
FIG. 12C

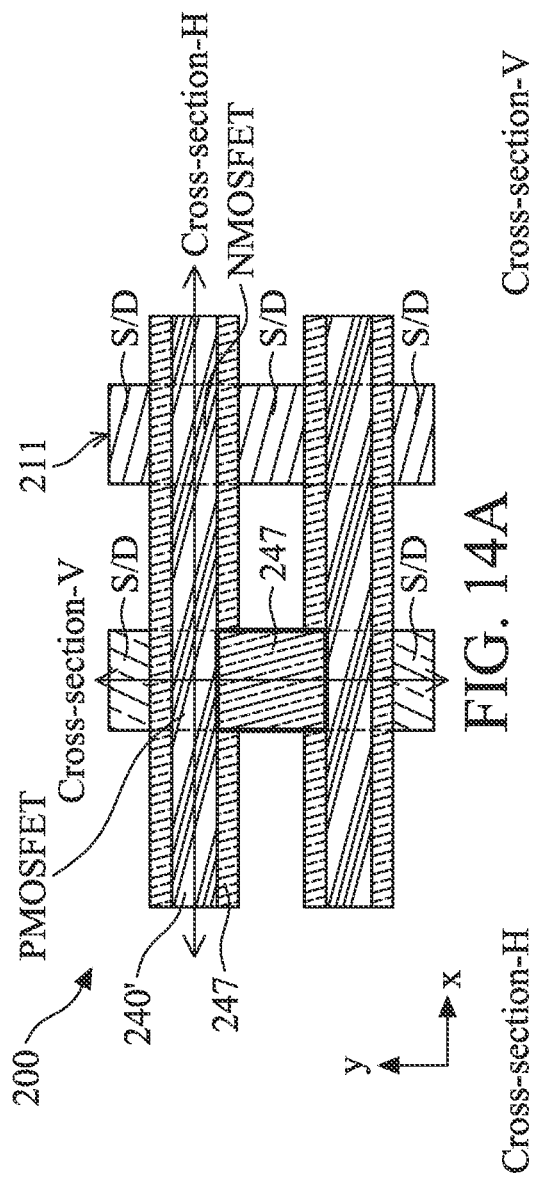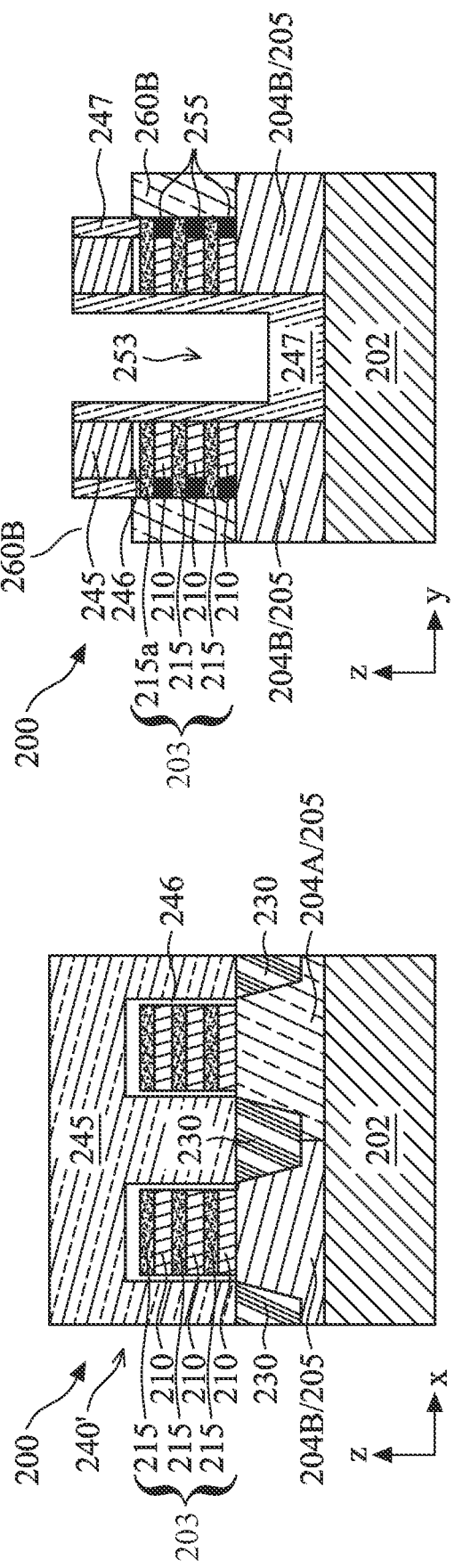
FIG. 14A
FIG. 14B
FIG. 14C

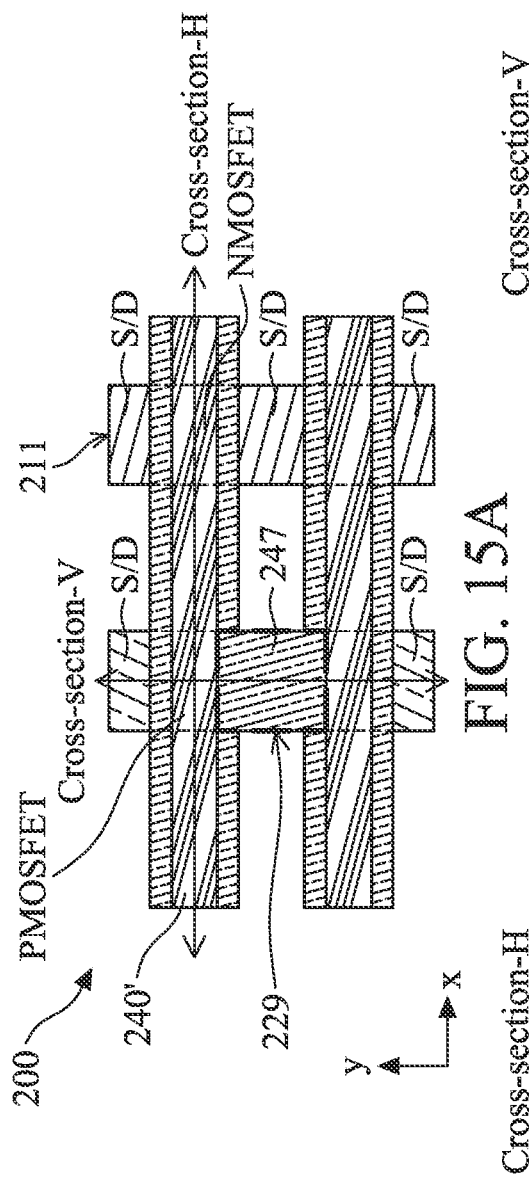
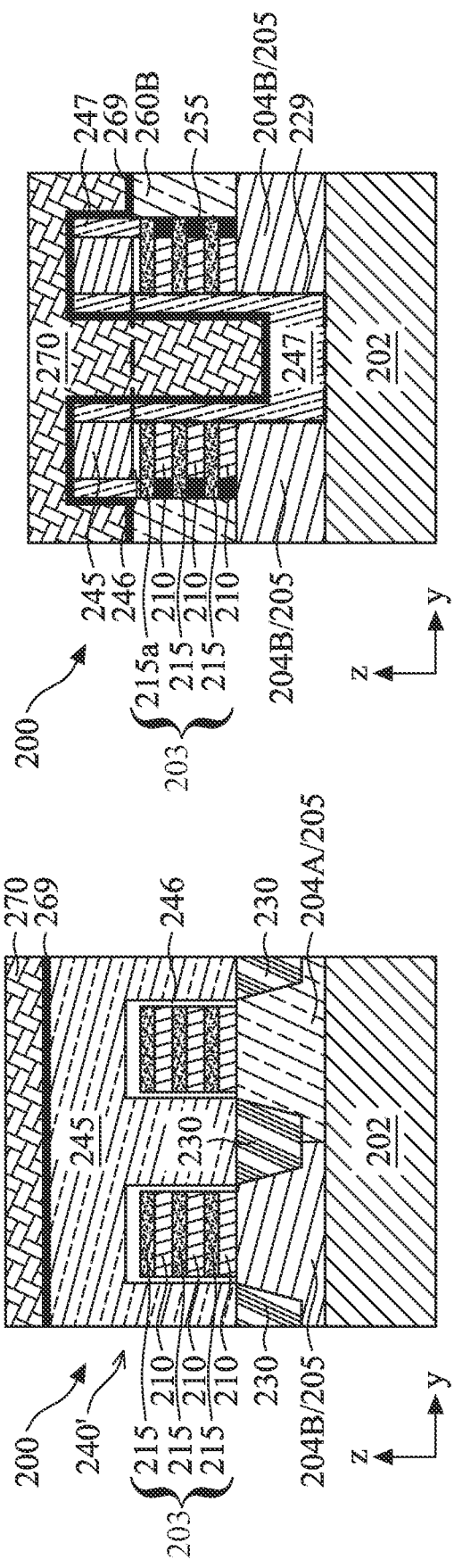
FIG. 15A
FIG. 15B
FIG. 15C

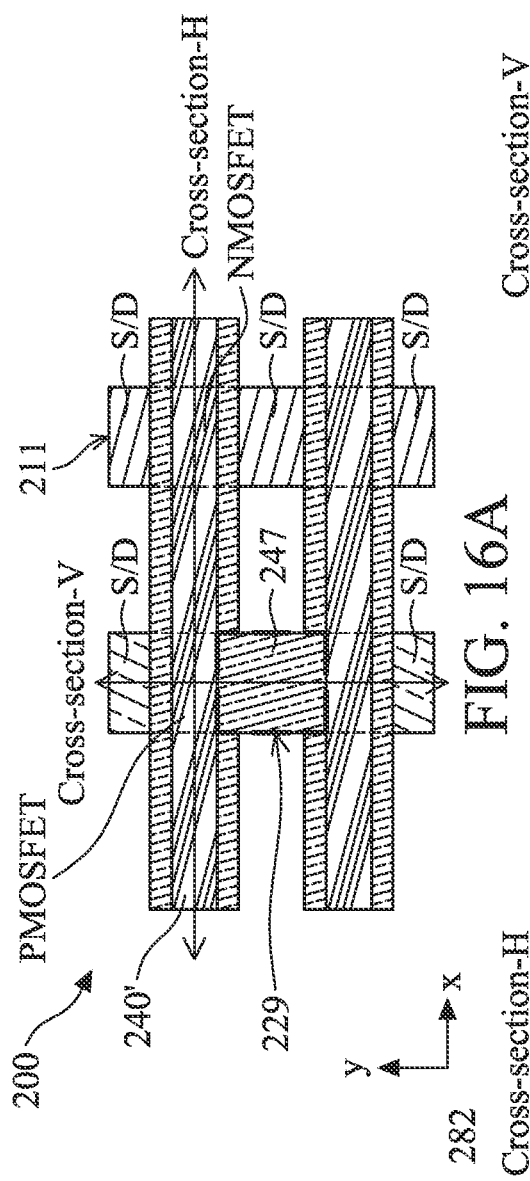
FIG. 16A
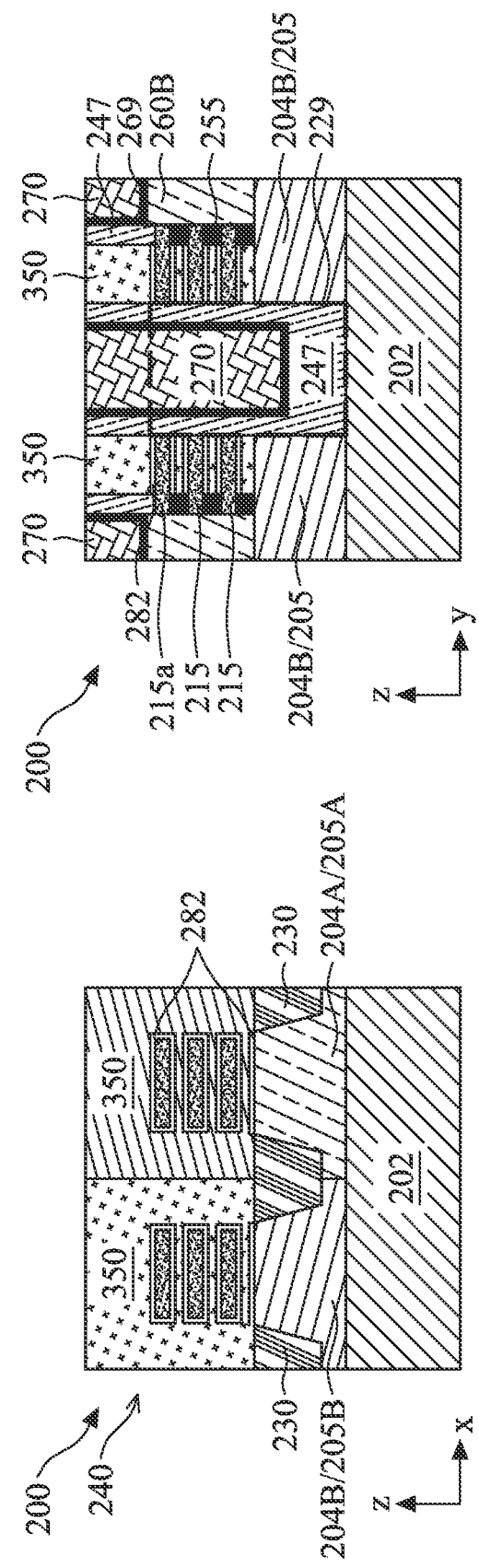
FIG. 16B
FIG. 16C

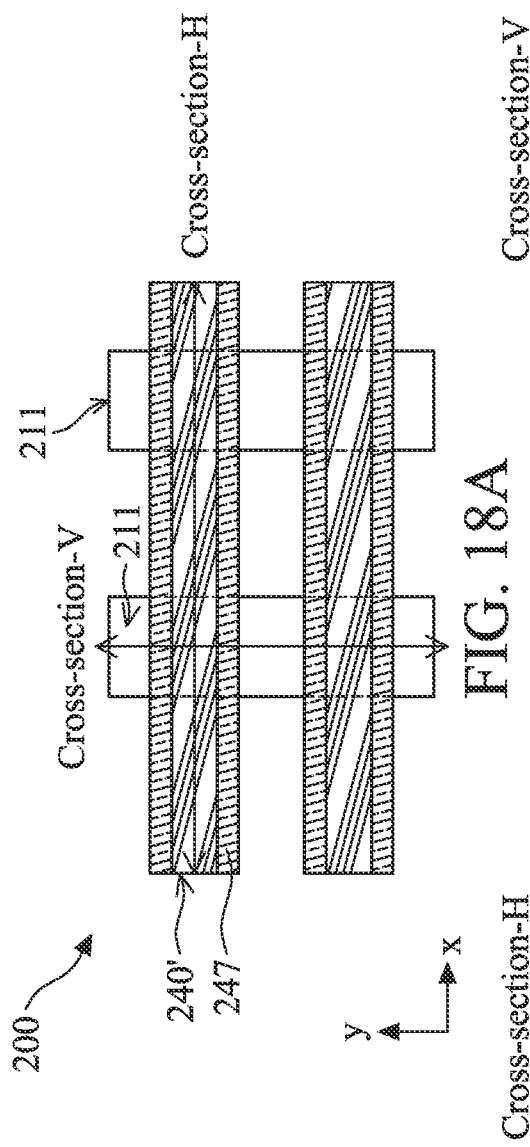
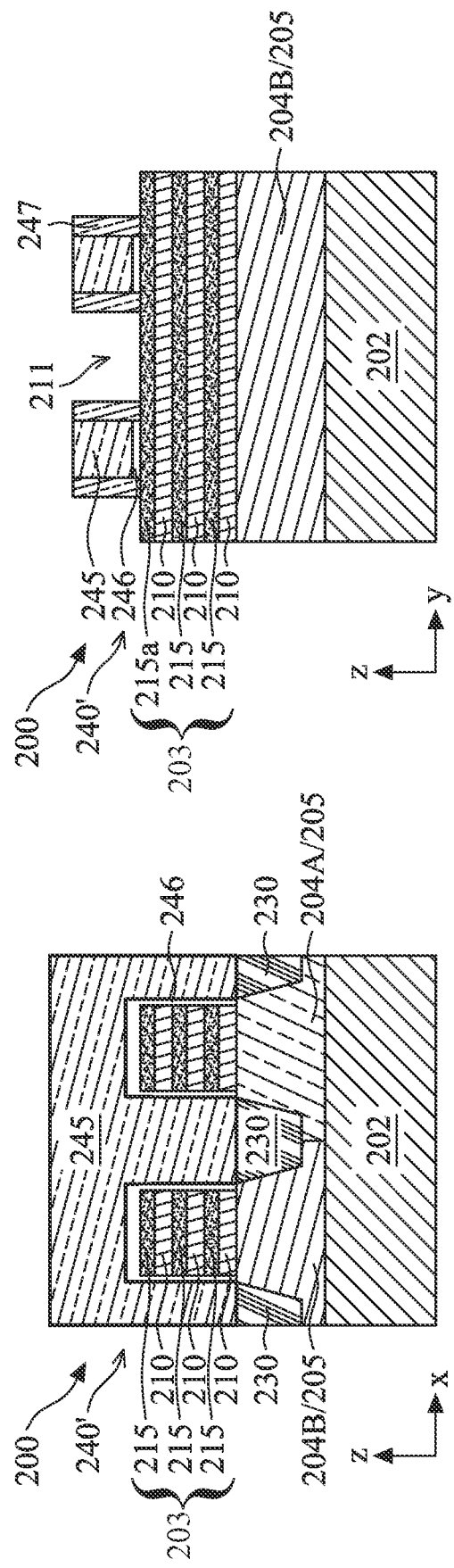
FIG. 18A
FIG. 18B
FIG. 18C

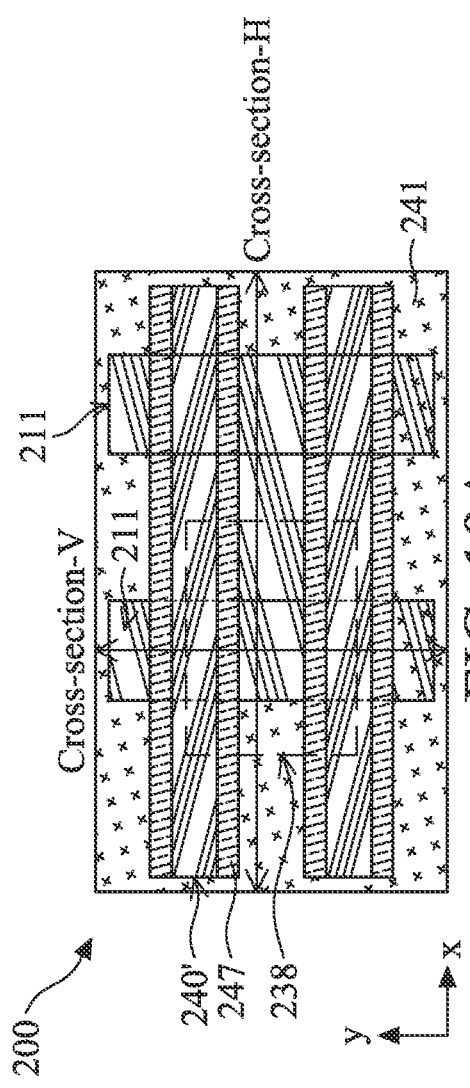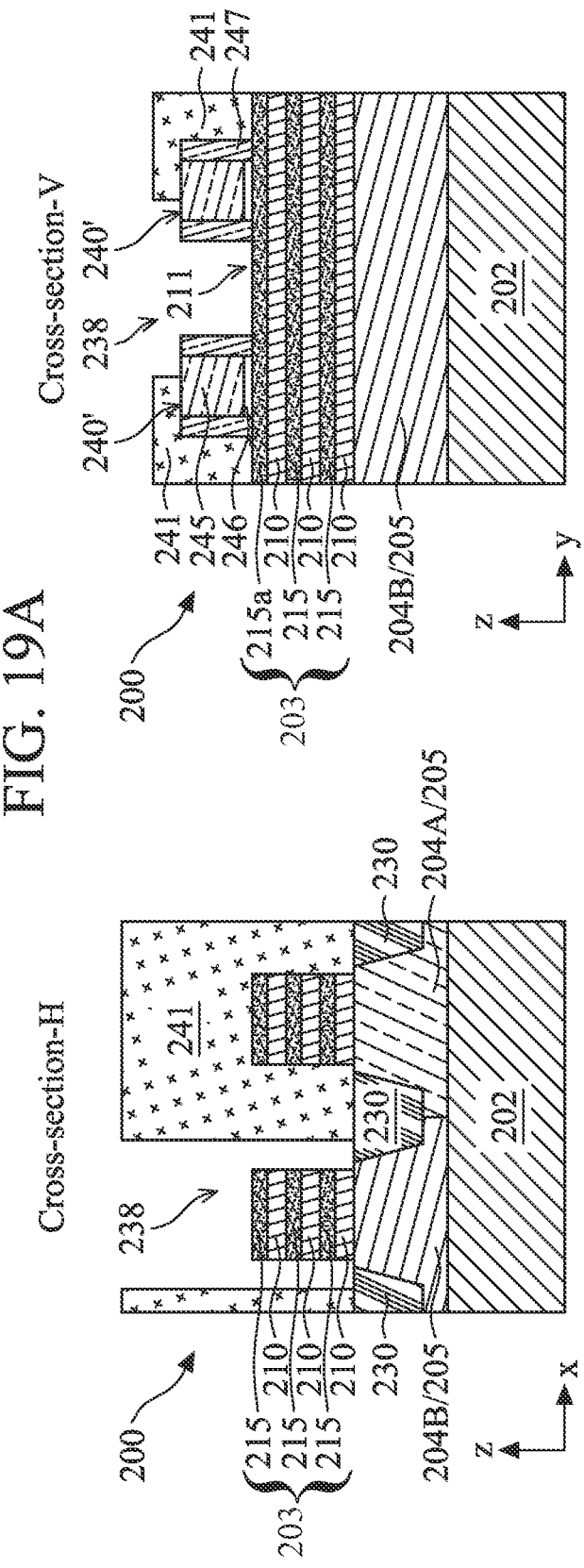
FIG. 19A
FIG. 19B
FIG. 19C

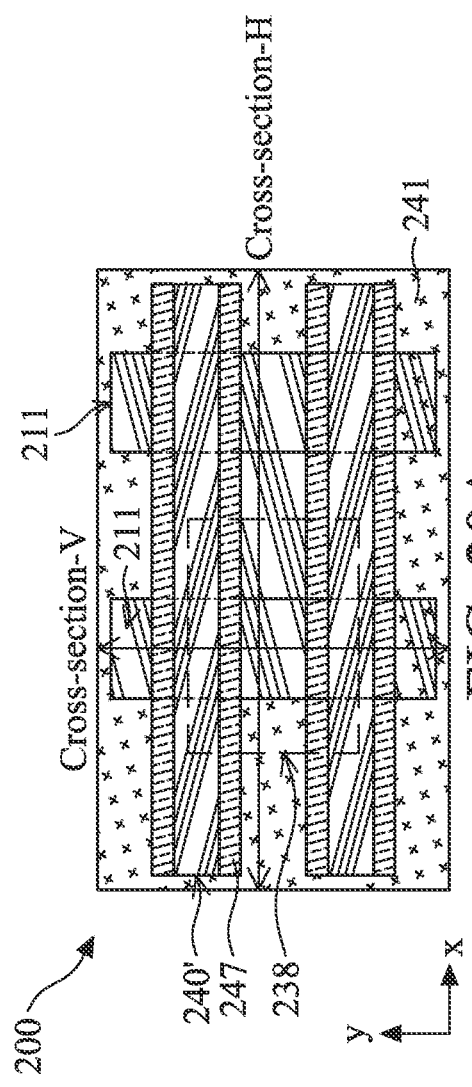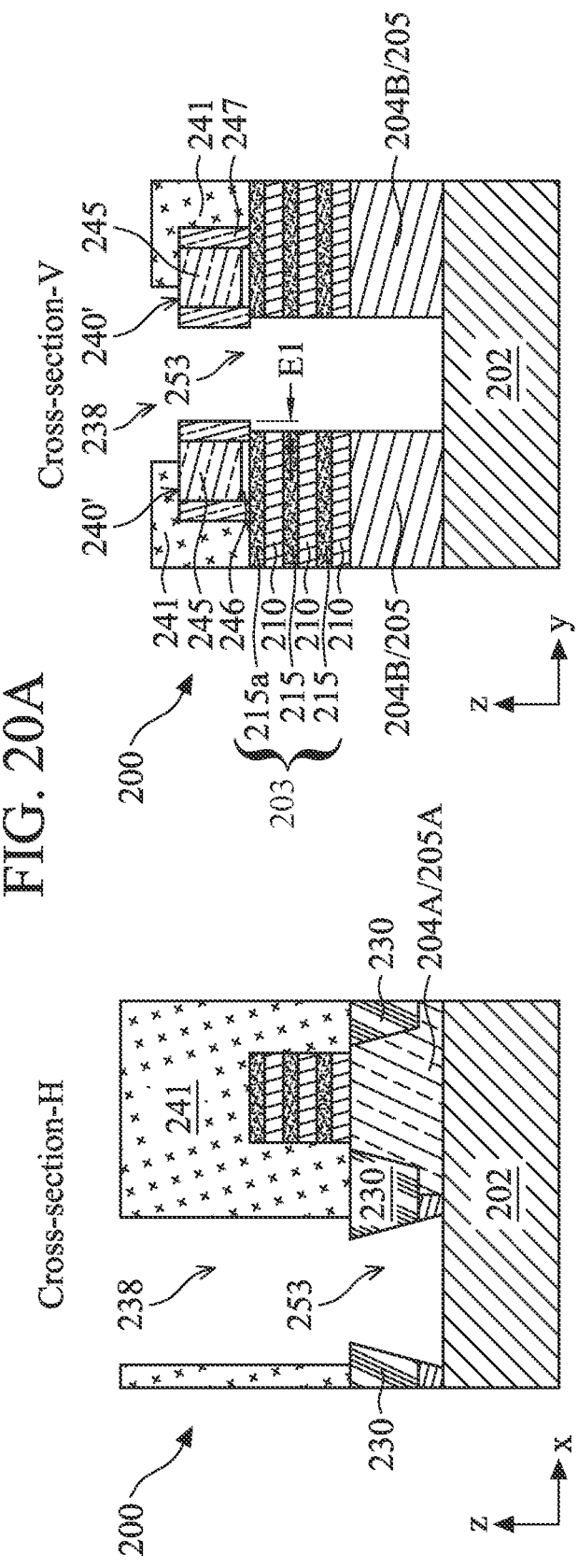
FIG. 20A
FIG. 20B
FIG. 20C

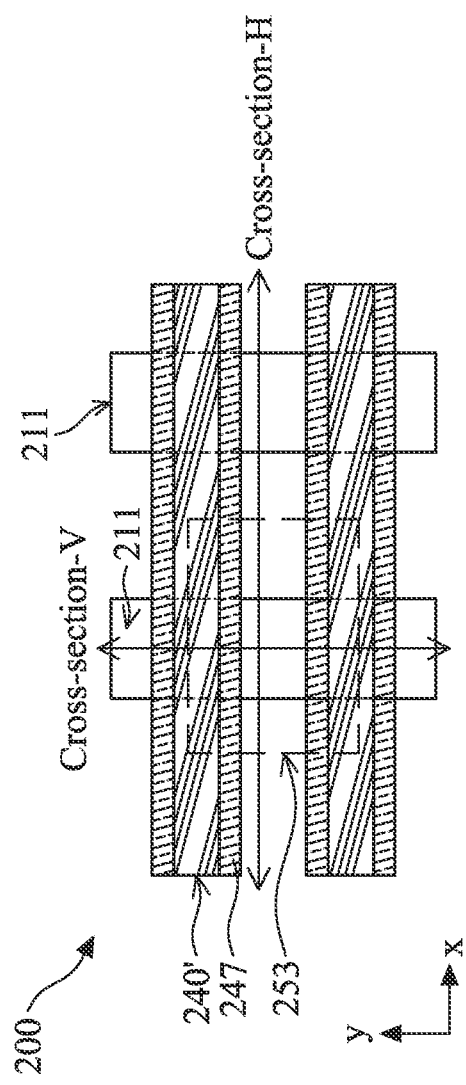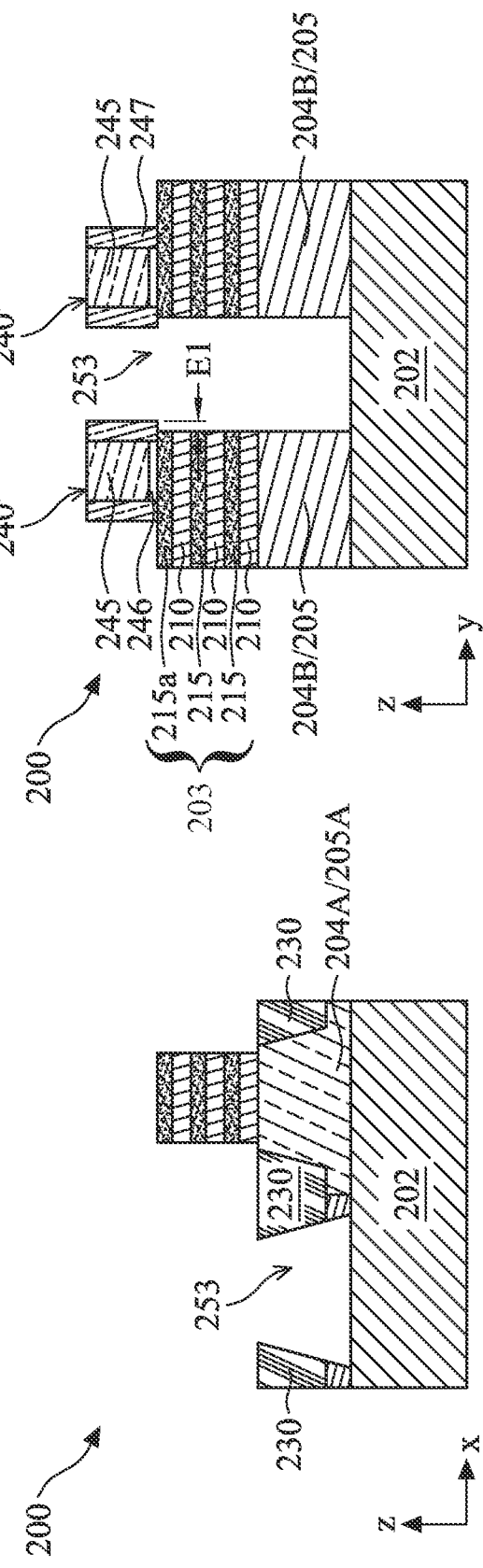

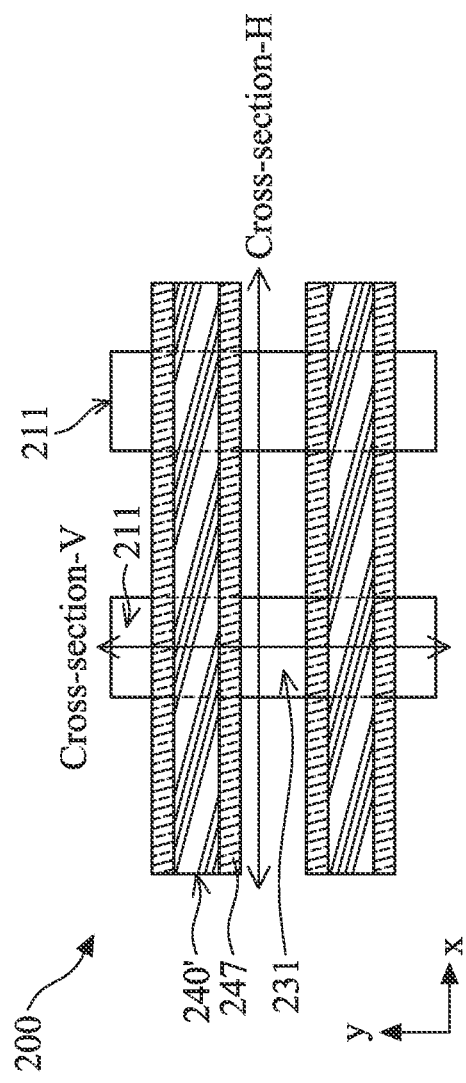
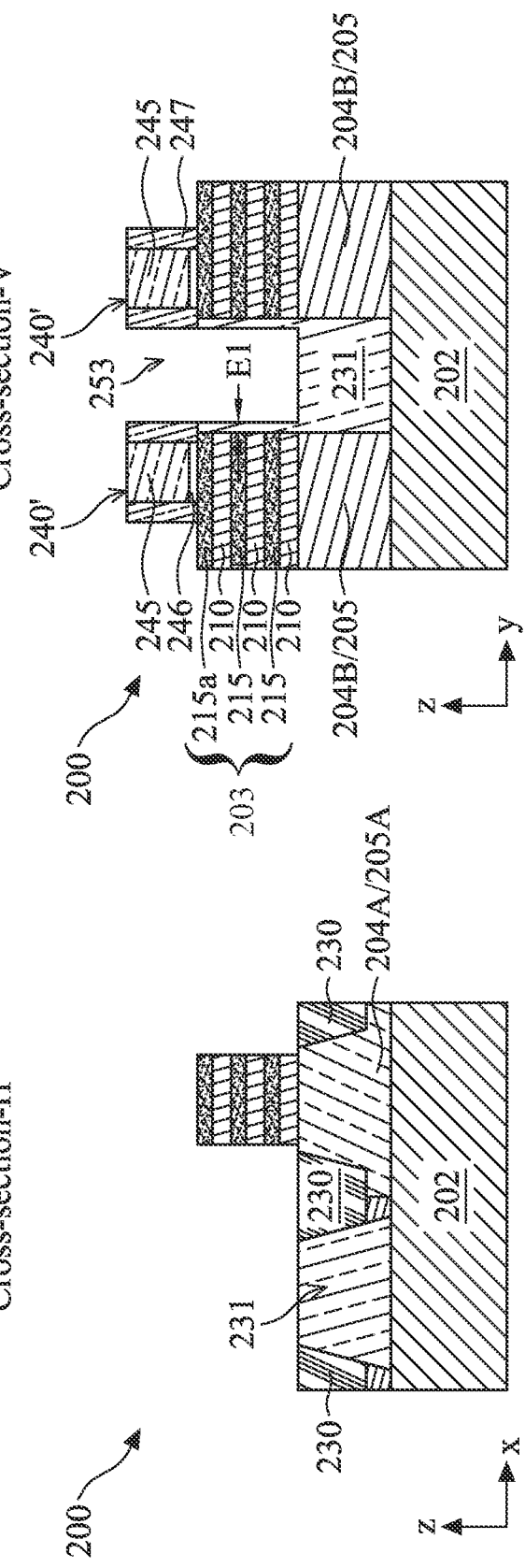
FIG. 22A
FIG. 22B
FIG. 22C

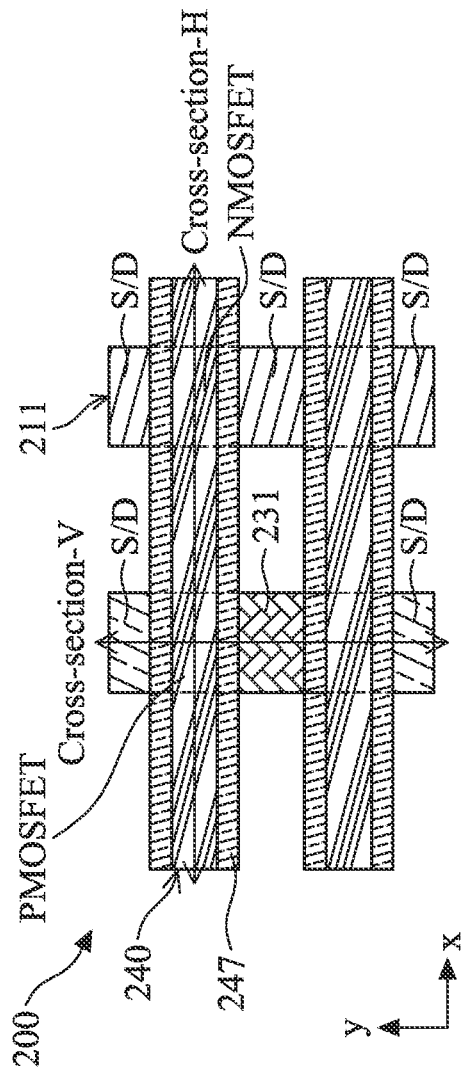
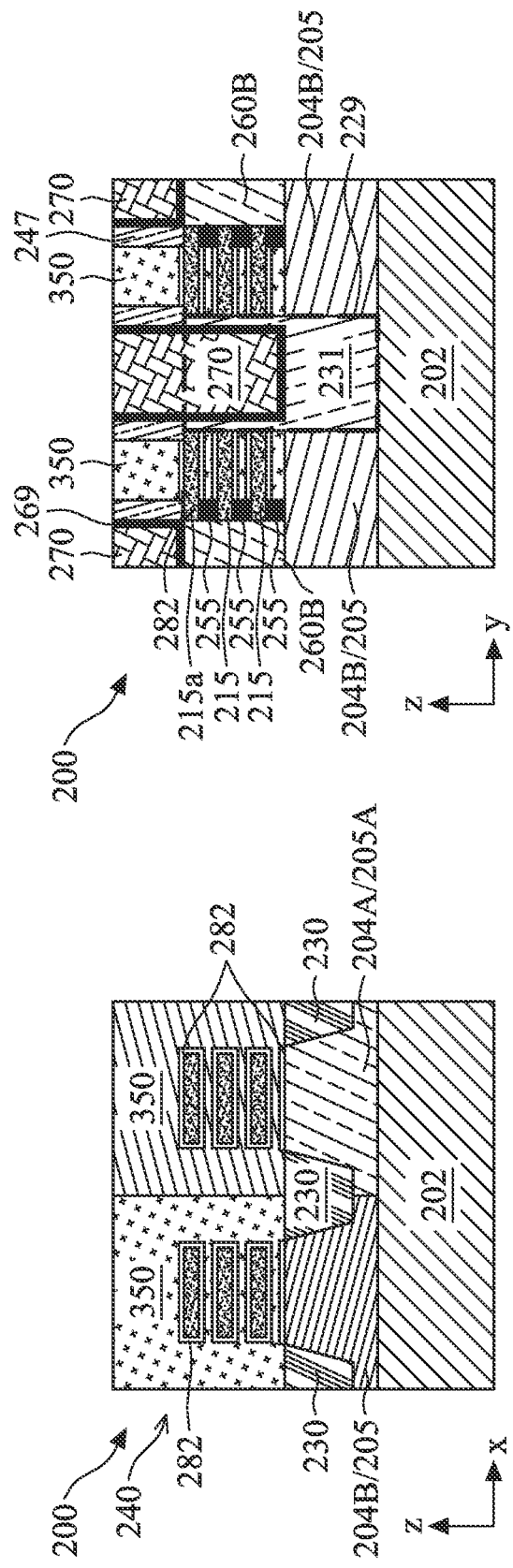
FIG. 23A
FIG. 23B
FIG. 23C

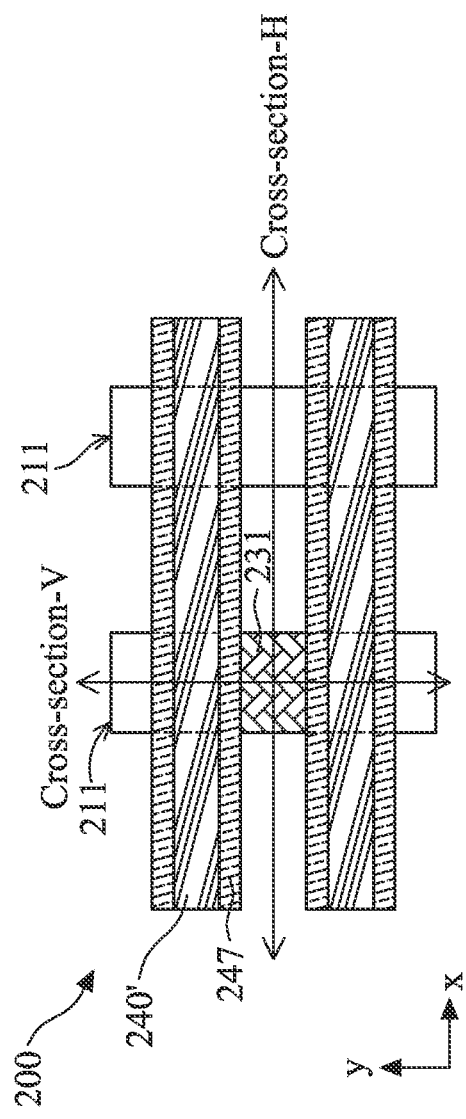
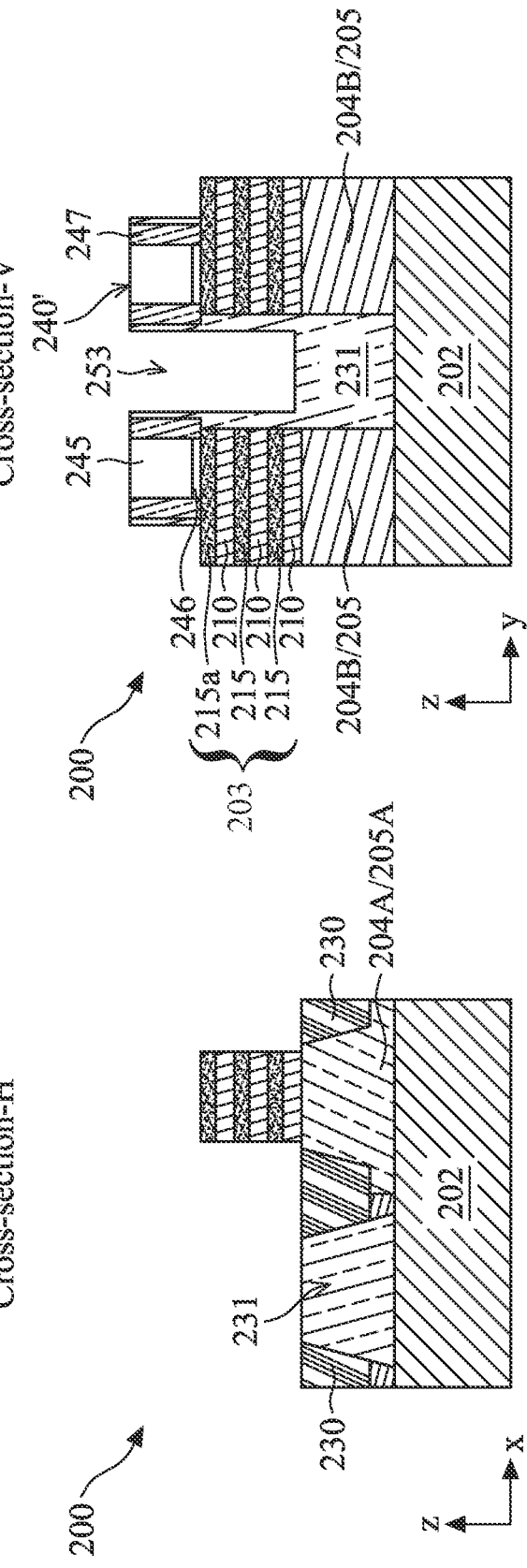
FIG. 24A
FIG. 24B
FIG. 24C

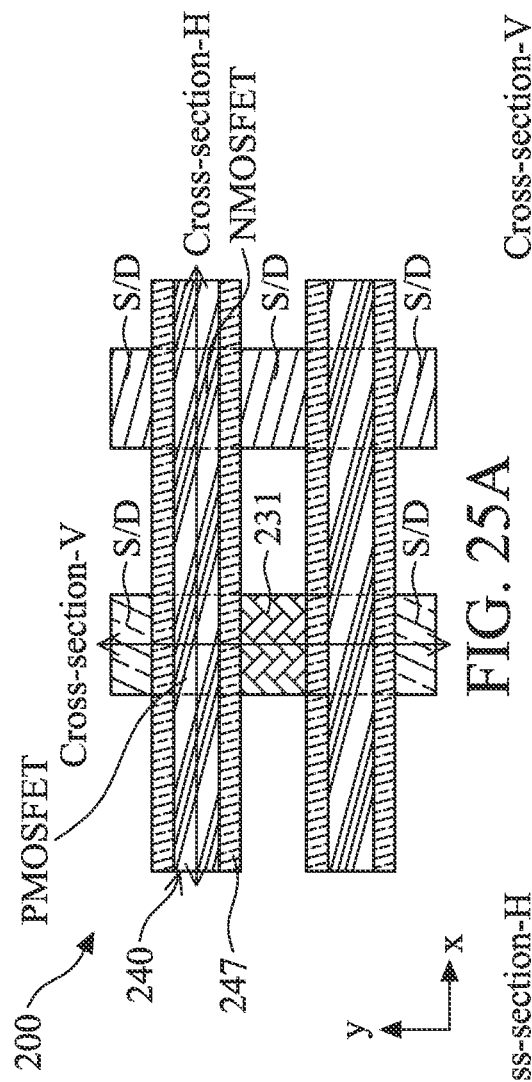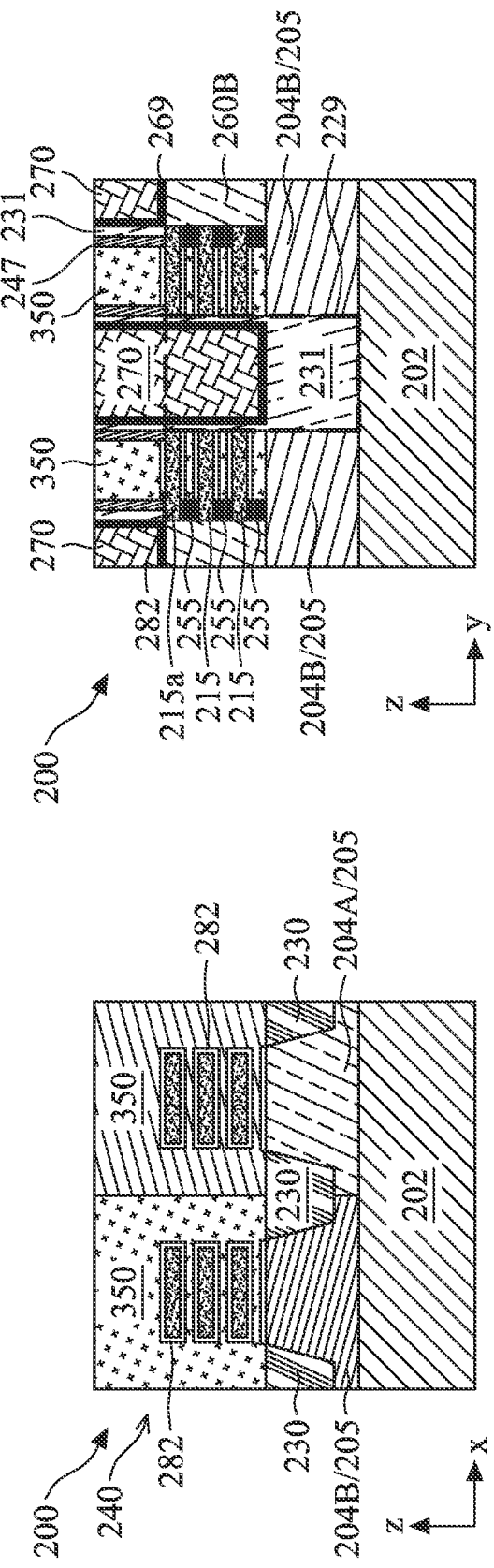

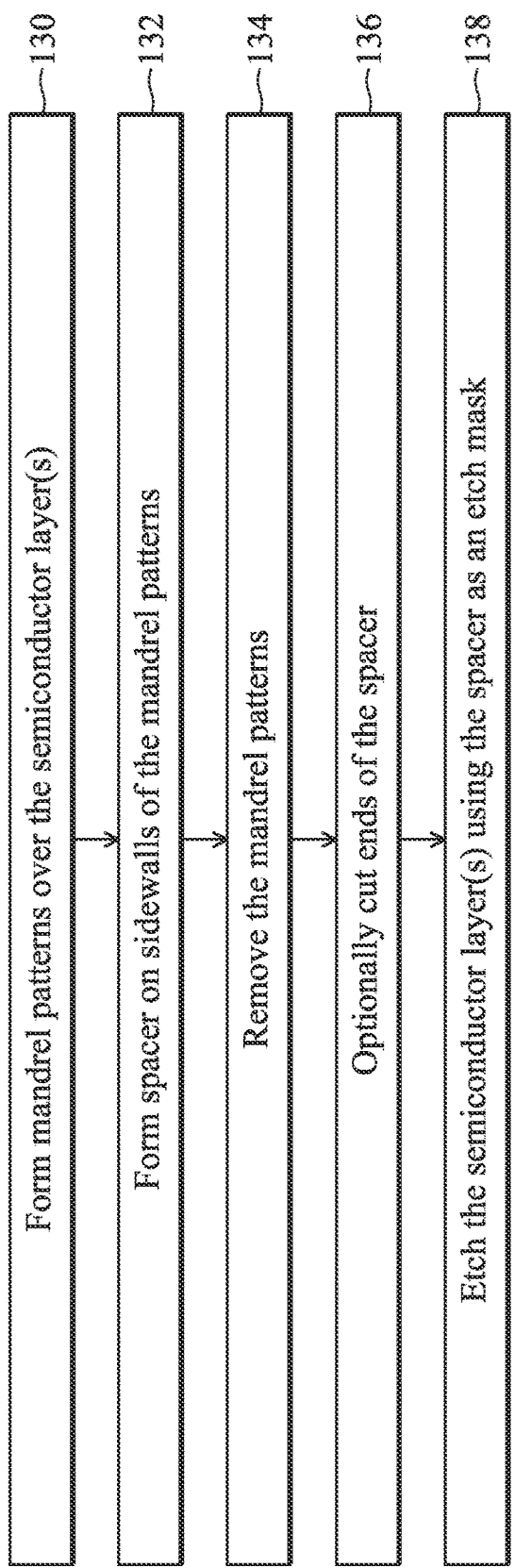

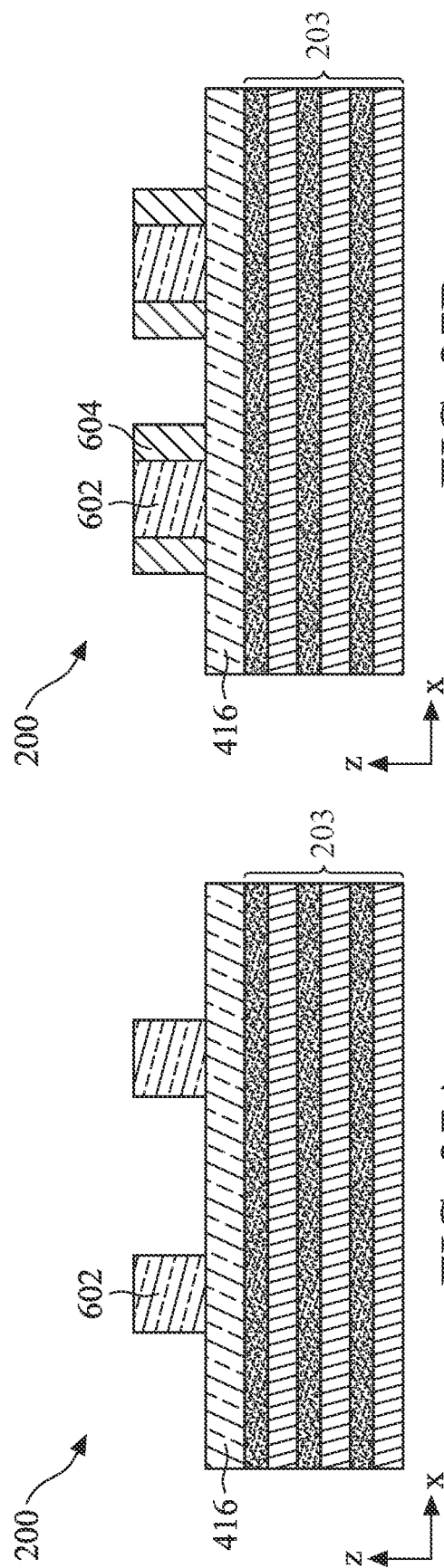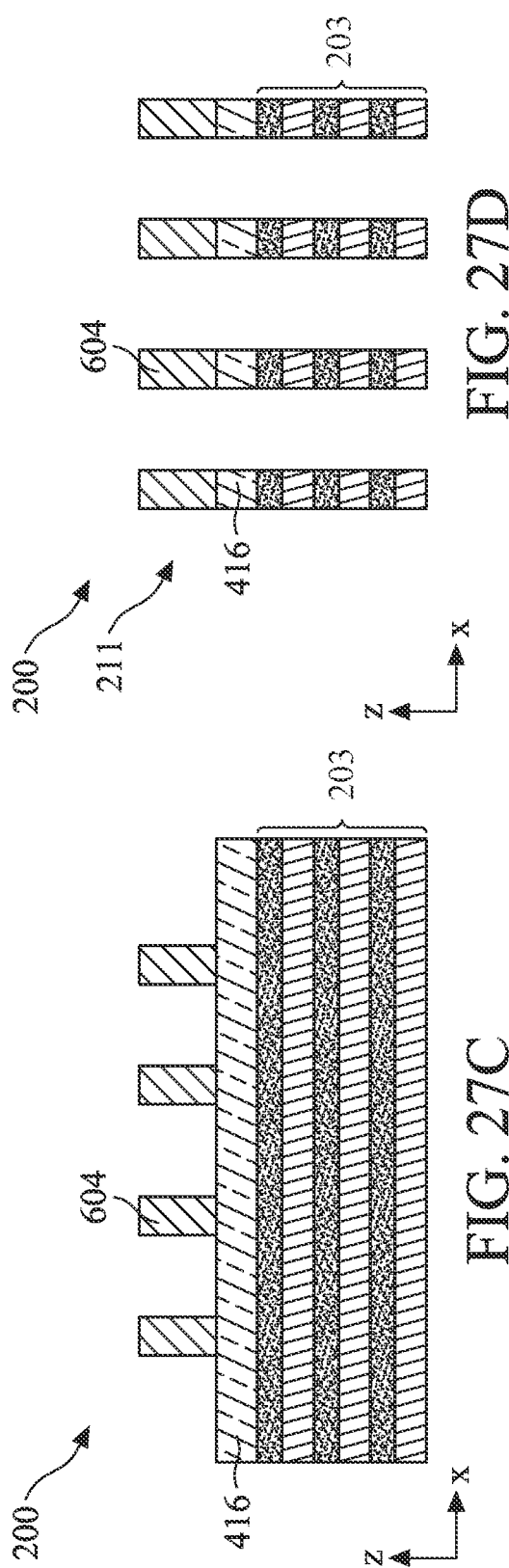

FIN END ISOLATION STRUCTURE FOR SEMICONDUCTOR DEVICES

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology. One such advance is desired in the manufacturing of active regions such as semiconductor fins in an IC. For example, how to isolate the ends of the semiconductor fins while reducing the layout dependent effect (LDE) to the uniformity of the semiconductor fin profile, and how to manufacture the semiconductor fins and gate structures such that source/drain epitaxial growth on an IC can be more uniform.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 17, and 26 show flow charts of methods for fabricating a semiconductor device according to various embodiments of the present disclosure.

FIGS. 4, 5, 6B, 7B, 8B, 8C, 9B, 9C, 10B, 10C, 11B, 11C, 12B, 12C, 13B, 13C, 14B, 14C, 15B, 15C, 16B, 16C, 18B, 18C, 19B, 19C, 20B, 20C, 21B, 21C, 22B, 22C, 23B, 23C, 24B, 24C, 25B, and 25C are fragmentary diagrammatic cross-sectional views of a semiconductor device, in portion, at various fabrication stages (such as those associated with the method in FIGS. 3, 17) according to various aspects of the present disclosure.

FIGS. 6A, 7A, 8A, 9A, 10A, 11A, 12A, 13A, 14A, 15A, 16A, 18A, 19A, 20A, 21A, 22A, 23A, 24A, and 25A are fragmentary diagrammatic top views of a semiconductor device, in portion, at various fabrication stages (such as those associated with the method in FIGS. 3, 17) according to various aspects of the present disclosure.

FIGS. 27A, 27B, 27C, and 27D are fragmentary diagrammatic cross-sectional views of a semiconductor device, in portion, at various fabrication stages (such as those associated with the method in FIG. 26) according to various aspects of the present disclosure.

DETAILED DESCRIPTION

Figure 1B:
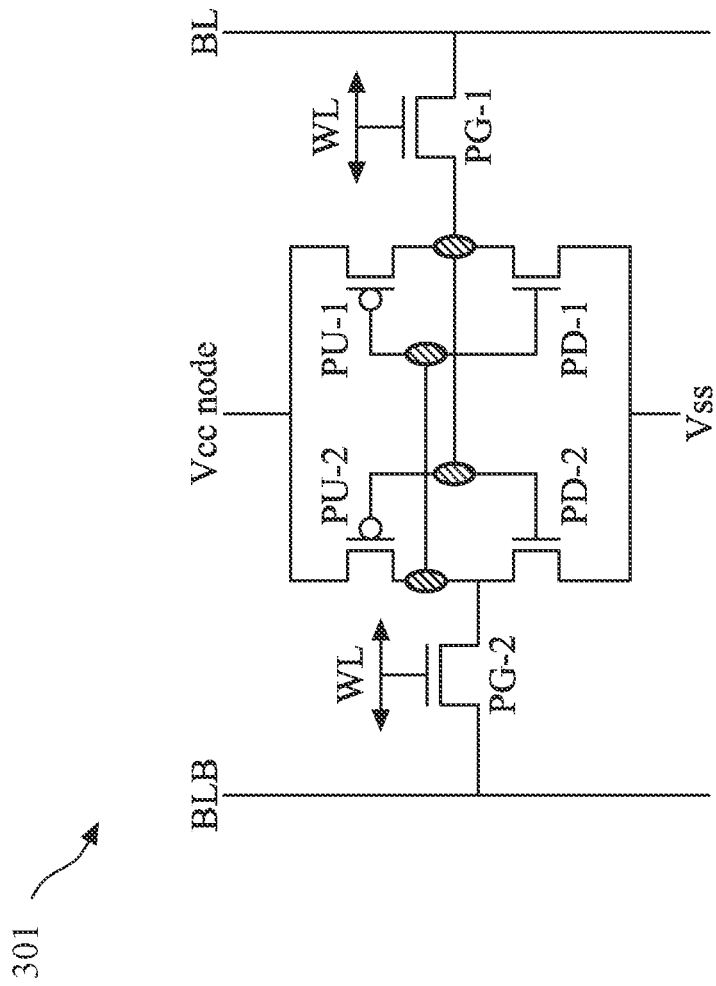
FIG. 1B shows a schematic view of a six-transistor (6T) single-port (SP) SRAM cell, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application relates to a semiconductor fabrication process and the structure thereof, and more particularly to isolating semiconductor fins in manufacturing FinFET or gate-all-around (GAA) devices such as vertically-stacked gate-all-around horizontal nanowire or nanosheet MOSFET devices. An objective of the present disclosure is to provide new fabrication processes that reduce the layout dependent effect (or stress) to semiconductor fins caused by isolation structures surrounding the semiconductor fins. Another objective is to increase the density and uniformity of gate structures over semiconductor fins such that source/drain trench etching and epitaxial growth can be more uniform across different areas of the IC. For the purposes of simplicity, the present disclosure uses the layout and structures of SRAM cells as an example to illustrate various inventive concepts of the present disclosure. Further, the example SRAM cells are implemented in FinFET or GAA structures. Those of ordinary skill in the art should appreciate that they may readily use the present disclosure as a basis for designing or modifying other processes and structures (such as logic circuits) for carrying out the same purposes and/or achieving the same advantages of the embodiments introduced herein.

Figure 1A:
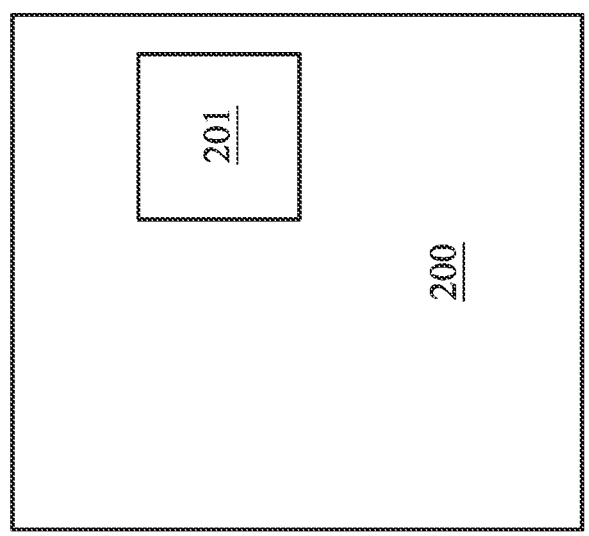
FIG. 1A is a simplified block diagram of an integrated circuit (IC), according to various aspects of the present disclosure.

FIG. 1A shows a semiconductor device 200. The semiconductor device 200 can be, e.g., a microprocessor, an application specific integrated circuit (ASIC), a field programmable gate array (FPGA), a digital signal processor (DSP), or a portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. The exact functionality of the semiconductor device 200 is not a limitation to the provided subject matter. In the present embodiment, the semiconductor device 200 includes an SRAM macro 201, which includes many SRAM cells, such as six-transistor (6T) single port (SP) SRAM cell 301 shown in FIG. 1B. Referring to FIG. 1B, the 6T SP SRAM cell 301 includes two PMOSFET (such as p-type FinFETs or p-type GAA transistors) as pull-up transistors, PU-1 and PU-2; two NMOSFET (such as n-type FinFETs or n-type GAA transistors) as pull-down transistors, PD-1 and PD-2; and two NMOSFET (such as n-type FinFETs or n-type GAA transistors) as pass-gate transistors, PG-1 and PG-2. The PU-1 and PD-1 are coupled to form an inverter. The PU-2 and PD-2 are coupled to form another inverter. The two inverters are cross-coupled to form a storage unit. FIG. 1B further shows word line (WL), bit line (BL), and bit line bar (BLB) for accessing the storage unit of the SRAM cell 301.

Figure 2A:
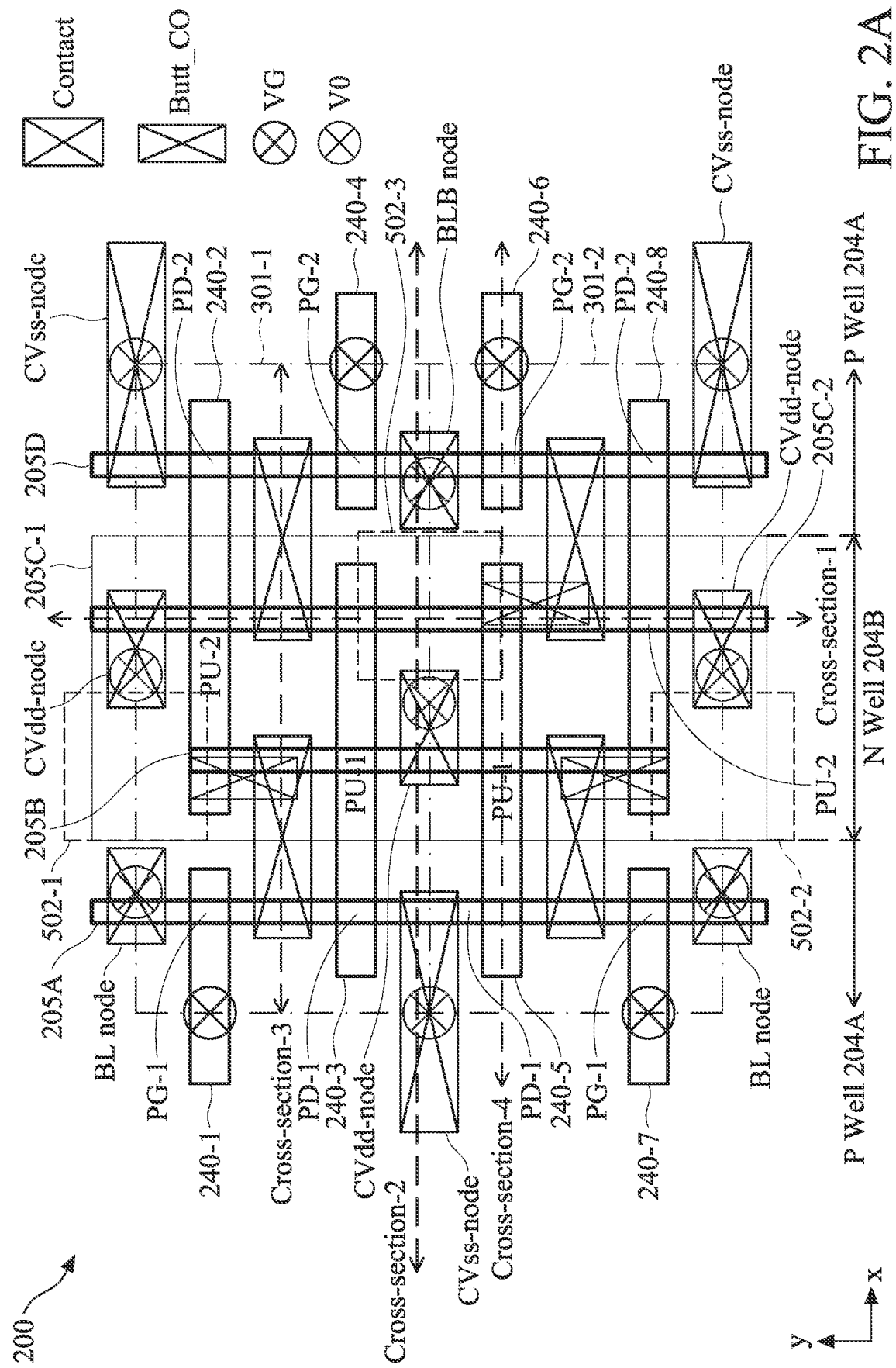
FIG. 2A shows a portion of a layout of the SRAM cell of FIG. 1B, in accordance with some embodiments.

FIG. 2A shows a layout of certain layers (or features) for two such SRAM cells 301, 301-1 and 301-2 that are adjacent to each other. Referring to FIG. 2A, the device 200 includes active regions 205 (including 205A, 205B, 205C-1, 205C-2, and 205D). In the present embodiment, the active regions 205 are in the form of semiconductor fins. Thus, they are also referred to as semiconductor fins (or fins) 205. The fins 205 are oriented lengthwise along the "y" direction. The device 200 further includes gate stacks 240 (including 240-1, 240-2, 240-3, 240-4, 240-5, 240-6, 240-7, and 240-8). The gate stacks 240 are oriented lengthwise along the "x" direction perpendicular to the "y" direction. The gate stacks 240 engage the fins 205 to form the PU-1, PU-2, PD-1, PD-2, PG-1, and PG-2 transistors for the SRAM cells 301-1 and 301-2. FIG. 2A further shows various contacts ("Contact"), butted contacts ("Butt_CO"), gate vias ("VG"), and source/drain vias ("V0"), which will be further described below. FIG. 2A further shows three dashed boxes 502-1, 502-2, and 502-3. These correspond to cut patterns (etch masks) that are used for cutting continuous fins into fin segments, and are referred to as fin-end-cut patterns (or cut patterns). For example, the cut patterns 502-1 and 502-2 are used to cut a continuous fin into multiple fin segments including the fin (or fin segment) 205B, and the cut pattern 502-3 is used to cut a continuous fin into multiple fin segments including the two fins (or two fin segments) 205C-1 and 205C-2. These will be further discussed below.

Figure 2B:
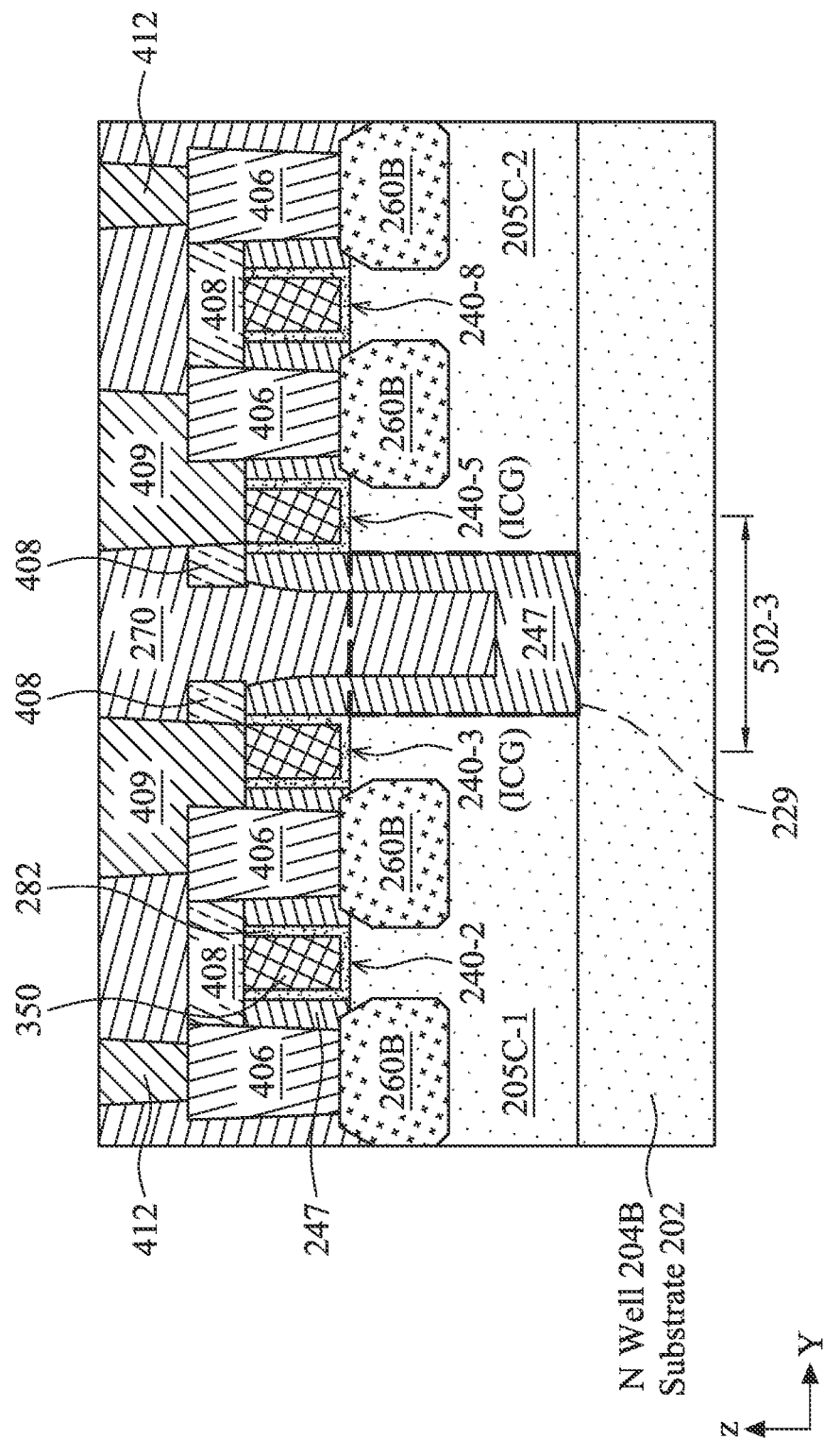
FIGS. 2B, 2G, and 2I show cross-sectional views of the SRAM cell of FIG. 2A, in portion, along the "Cross-section-1" line in FIG. 2A, in accordance with three embodiments of the present disclosure.
Figure 2C:
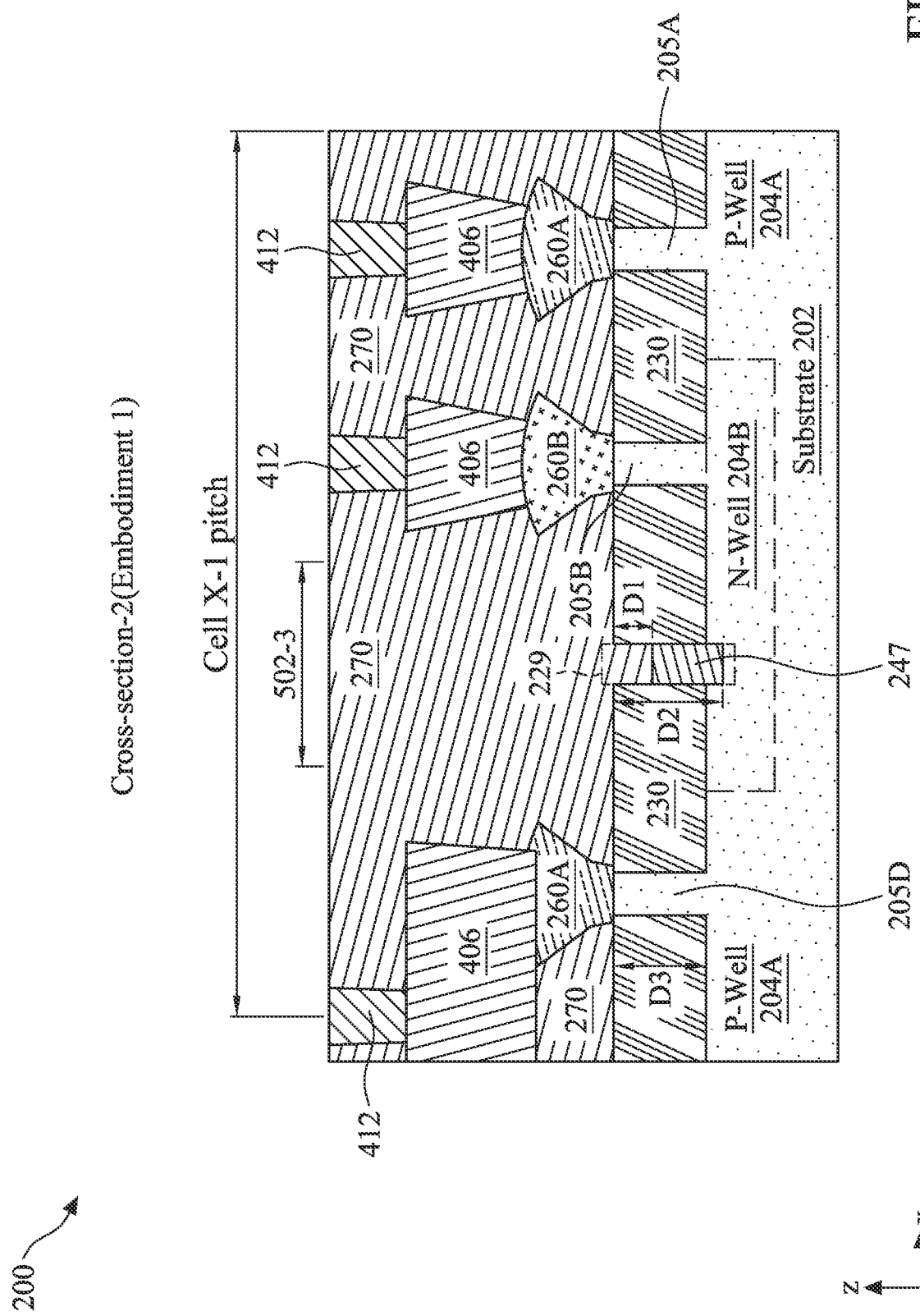
FIGS. 2C and 2H show cross-sectional views of the SRAM cell of FIG. 2A, in portion, along the "Cross-section-2" line in FIG. 2A, in accordance with different embodiments of the present disclosure.
Figure 2D:
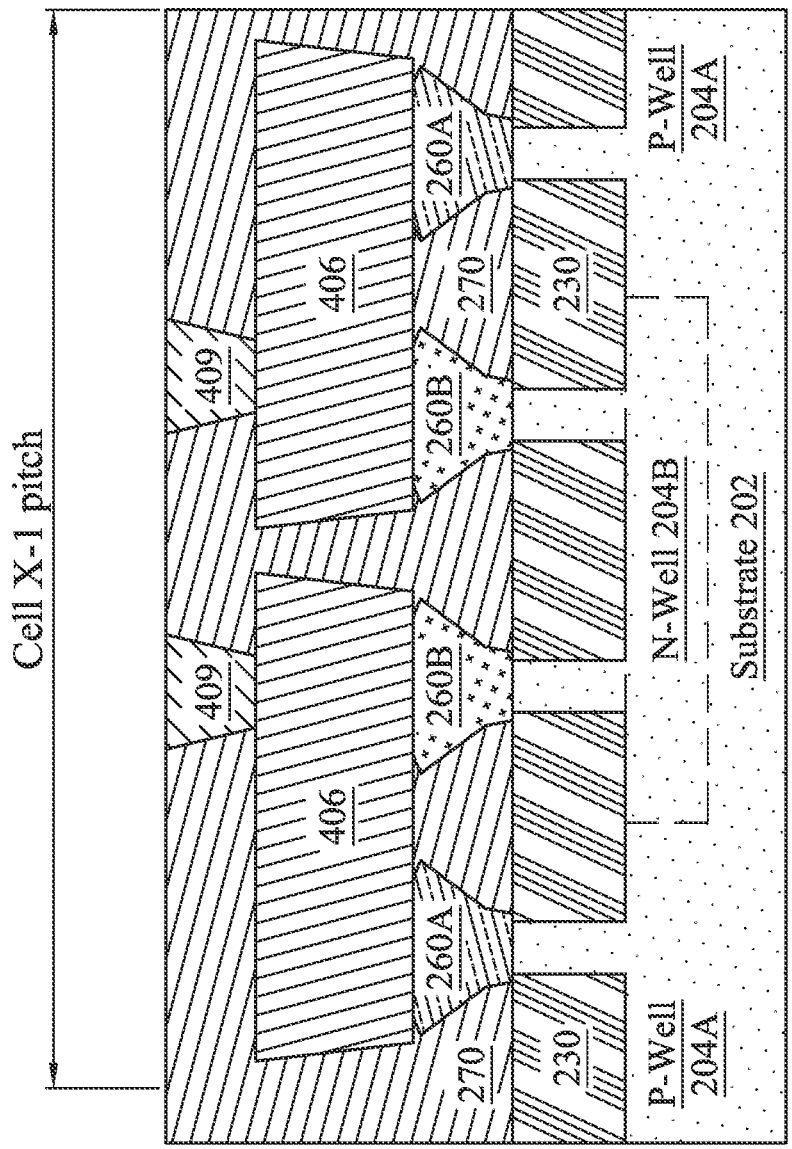
FIG. 2D shows a cross-sectional view of the SRAM cell of FIG. 2A, in portion, along the "Cross-section-3" line in FIG. 2A, in accordance with an embodiment of the present disclosure.
Figure 2E:
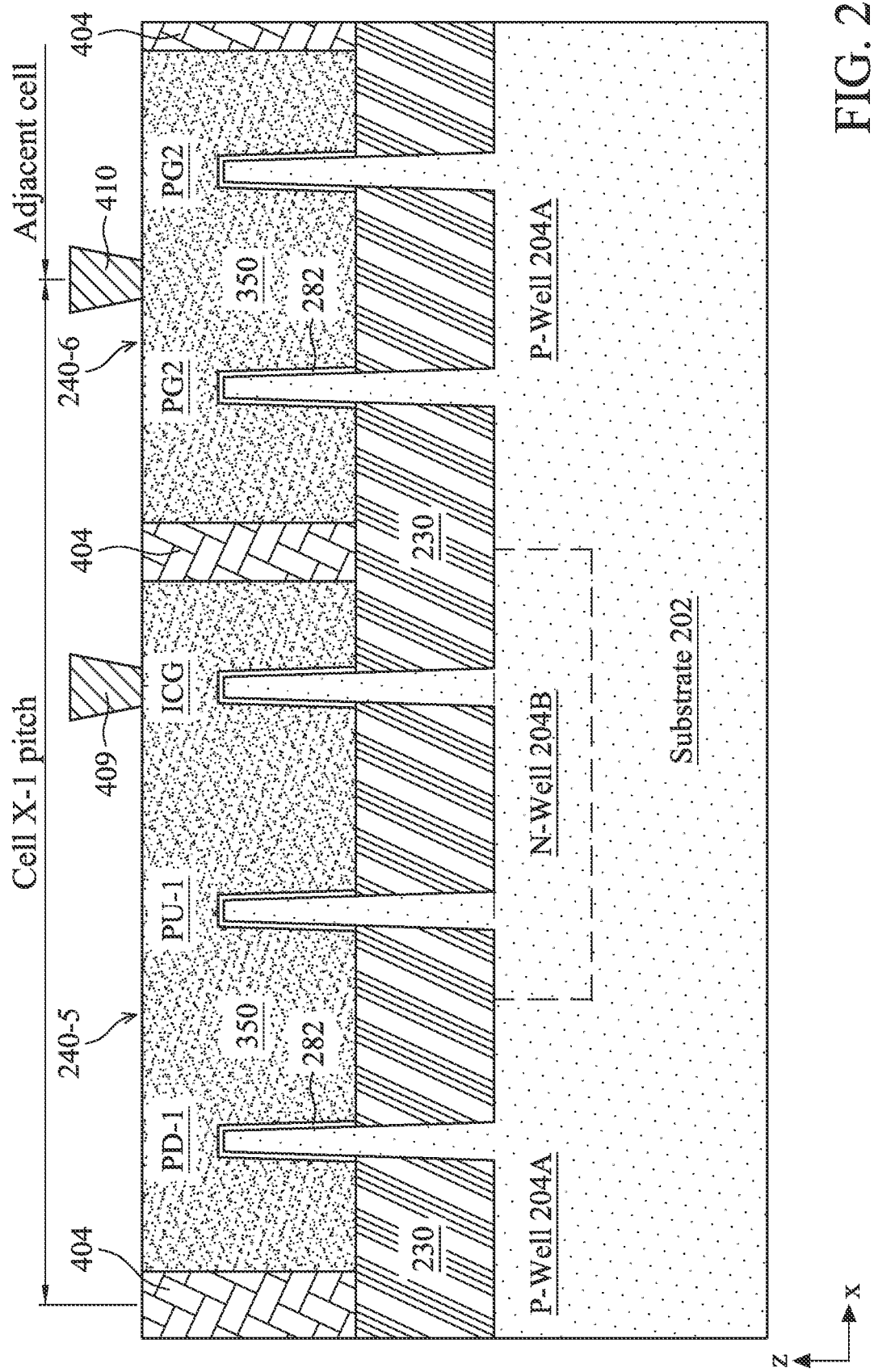
FIGS. 2E and 2F show cross-sectional views of the SRAM cell of FIG. 2A, in portion, along the "Cross-section-4" line in FIG. 2A, in accordance with different embodiments of the present disclosure.
Figure 2F:
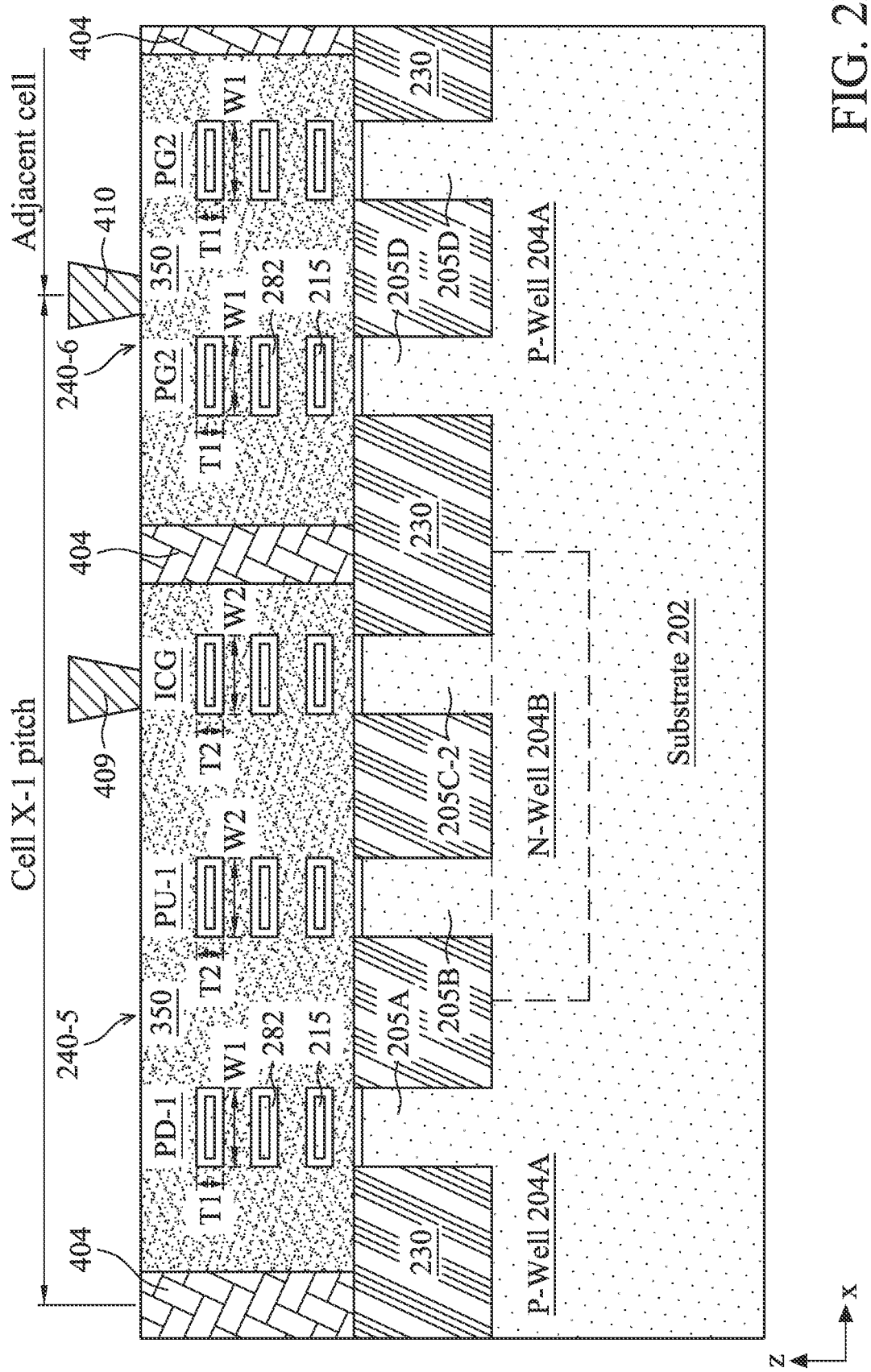
Figure 2G:
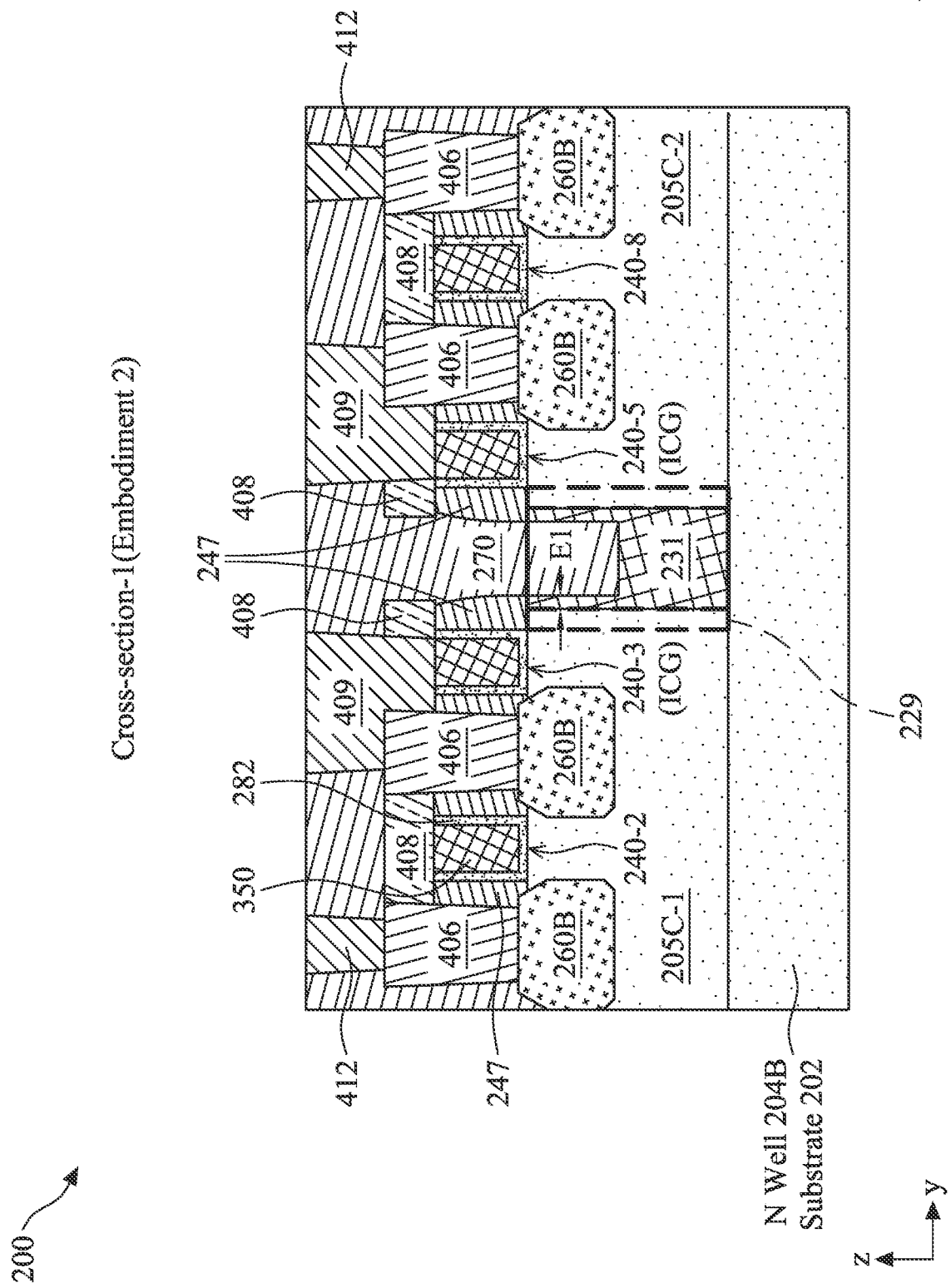
Figure 2H:
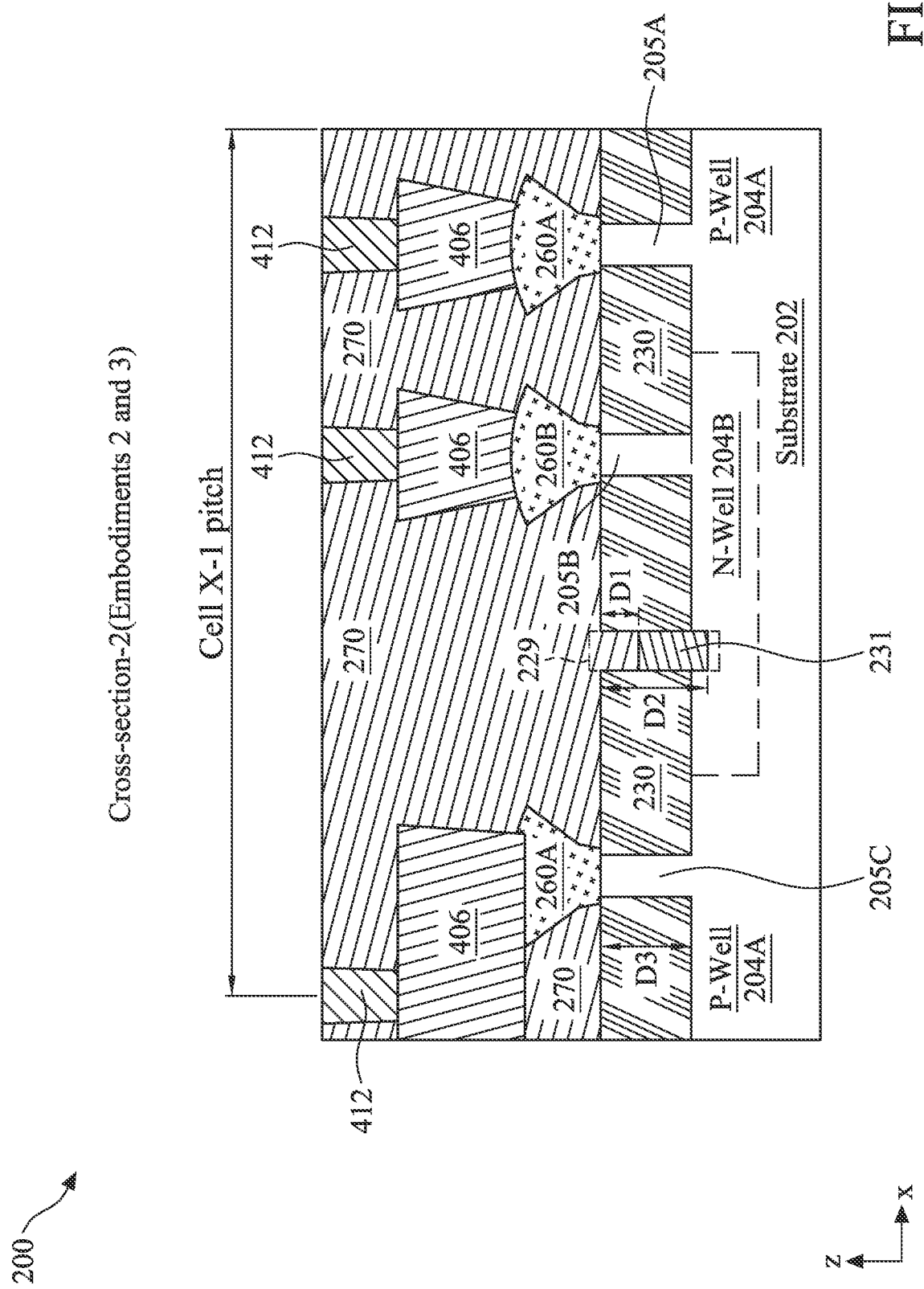
Figure 2I:
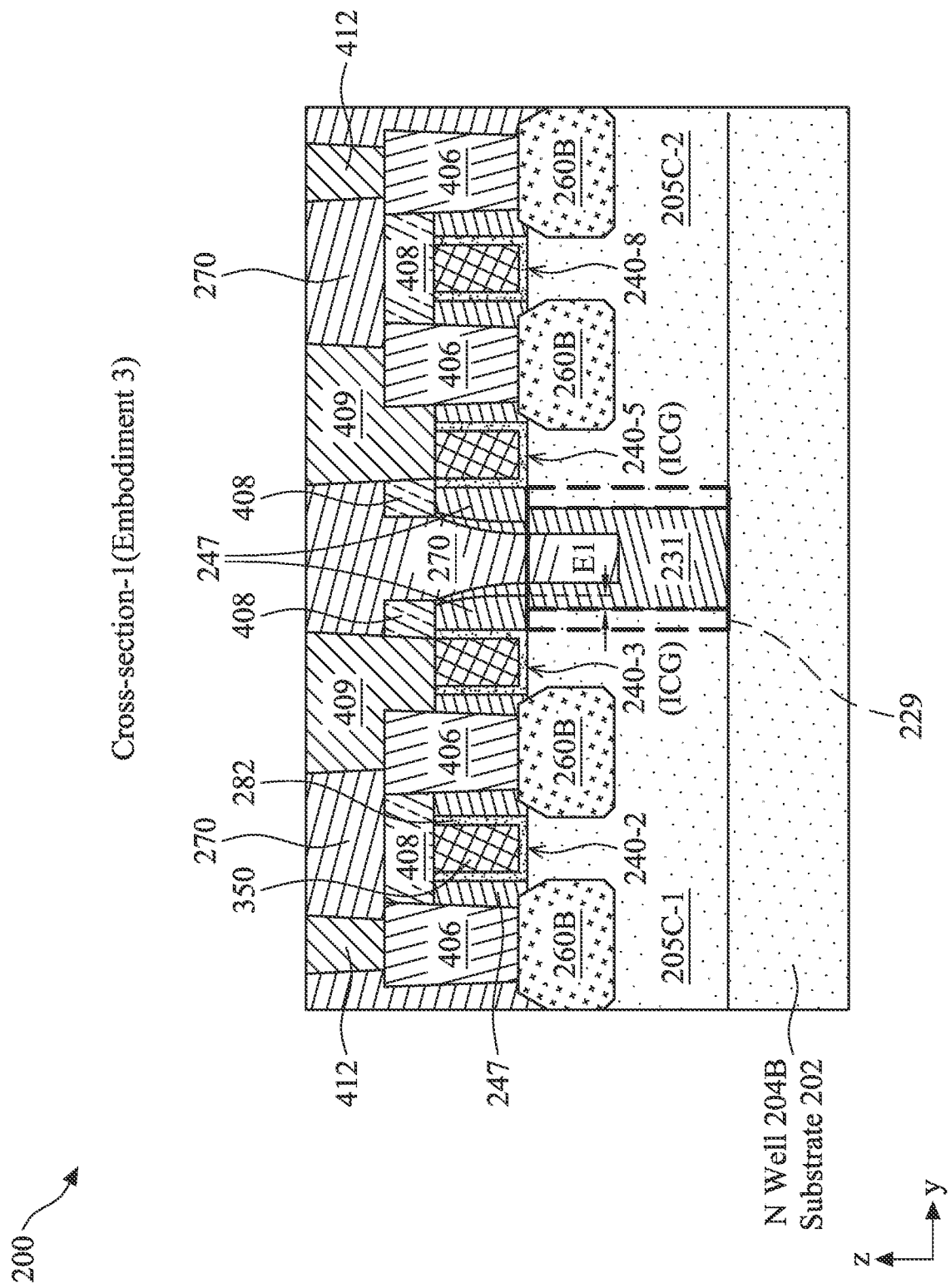

FIGS. 2B, 2G, and 2I are diagrammatic cross-sectional views of the semiconductor device 200 in FIG. 2A, in portion, along the "Cross-section-1" line in FIG. 2A, according to three embodiments of the present disclosure (First, Second, and Third Embodiment). FIG. 2C is a diagrammatic cross-sectional view of the semiconductor device 200 in FIG. 2A, in portion, along the "Cross-section-2" line in FIG. 2A, according to the First Embodiment. FIG. 2H is a diagrammatic cross-sectional view of the semiconductor device 200 in FIG. 2A, in portion, along the "Cross-section-2" line in FIG. 2A, according to the Second and Third Embodiments. FIG. 2D is a diagrammatic cross-sectional view of the semiconductor device 200 in FIG. 2A, in portion, along the "Cross-section-3" line in FIG. 2A, according to any of the First, Second, and Third Embodiments. FIG. 2E is a diagrammatic cross-sectional view of the semiconductor device 200 in FIG. 2A, in portion, along the "Cross-section-4" line in FIG. 2A, according to any of the First, Second, and Third Embodiments where the transistors are FinFETs. FIG. 2F is a diagrammatic cross-sectional view of the semiconductor device 200 in FIG. 2A, in portion, along the "Cross-section-4" line in FIG. 2A, according to any of the First, Second, and Third Embodiments where the transistors are GAA transistors.

The first embodiment of the present disclosure is described by referring to FIGS. 2B, 2C, 2D, 2E, and 2F. Referring to FIG. 2B, the device 200 includes a substrate 202, over which the various features including the gate stacks 240 and the fins 205 are formed. In an embodiment, substrate 202 includes silicon, such as a silicon wafer. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

Substrate 202 includes various doped regions 204A and 204B. In the present embodiment, the regions 204A are p-type doped regions (referred to hereinafter as a p-well), which can be configured for n-type transistors, and the regions 204B are n-type doped regions (referred to hereinafter as an n-well), which can be configured for p-type transistors. N-type doped regions, such as n-well 204B, are doped with n-type dopants, such as phosphorus, arsenic, other n-type dopant, or combinations thereof. P-type doped regions, such as p-well 204A, are doped with p-type dopants, such as boron, indium, other p-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

As shown in FIGS. 2B and 2C, the fins 205A, 205B, 205C-1, 205C-2, and 205D (collectively referred to as fins 205) are disposed over the doped regions 204A and 204B. In some embodiments, fins 205 are formed by patterning upper portions of the doped regions 204A and 204B, respectively, into the shapes of fins. The fins 205 may be patterned by any suitable method. For example, the fins 205 may be patterned using one or more photolithography processes, including double-patterning or multi-patterning processes.

As shown in FIGS. 2C and 2D, the device 200 further includes an isolation structure (or isolation features) 230 over the substrate 202 and adjacent to the sidewalls of the fins 205. As shown in FIG. 2D, the isolation structure 230 extends from a sidewall of a fin 205 to a sidewall of an adjacent fin 205 along the "x" direction. The isolation structure 230 may include silicon oxide, silicon nitride, silicon oxynitride, other suitable isolation material (for example, including silicon, oxygen, nitrogen, carbon, or other suitable isolation constituent), or combinations thereof. The isolation structure 230 may include different structures, such as shallow trench isolation (STI) structures, deep trench isolation (DTI) structures, and/or local oxidation of silicon (LOCOS) structures. For example, the isolation structure 230 can include STI features that define and electrically isolate fins 205 from other active device regions (such as fins) and/or passive device regions. In some embodiments, STI features include a multi-layer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

As shown in FIGS. 2B and 2C, in areas corresponding to the cut patterns 502 (such as the cut pattern 502-3), the device 200 includes another isolation feature 229 in a space that is formerly occupied by a portion of the fin 502. The isolation feature 229 is formed with a fin-end-cut process according to the present disclosure, which will be further discussed below. As shown in FIG. 2B, along the "y" direction (the lengthwise direction of the fins 205), the isolation feature 229 extends from an end of the fin 205C-1 to an end of the fin 205C-2, where the two ends of the fins face each other. As shown in FIG. 2C, along the "x" direction (the widthwise direction of the fins 205), the isolation feature 229 extends from a sidewall of the isolation structure 230 to another sidewall of the isolation structure 230, where the two sidewalls of the isolation structure 230 face each other. The isolation structure 230 has a thickness D3 above the substrate 202. The isolation feature 229 extends a depth (or height) D2 below the top surface of the isolation structure 230. In an embodiment, the depth D2 is greater than the thickness D3 to ensure that the fins 205C-1 and 205C-2 are completely isolated from each other. The isolation feature 229 includes a different material than the isolation structure 230. In the present embodiment, the isolation feature 229 includes a portion of a gate spacer layer 247 and a portion of an inter-layer dielectric (ILD) layer 270. The spacer layer 247 and the ILD layer 270 are further describe below. As shown in FIG. 2C, the ILD layer 270 extends a depth D1 below the top surface of the isolation structure 230. In some embodiments, the depth D1 is in a range of about 5 nm to about 35 nm. Even though not shown in FIGS. 2B and 2C, the isolation feature 229 may further include a portion of a contact etch stop layer (CESL) between the spacer layer 247 and the ILD layer 270.

Still referring to FIG. 2B, in this embodiment, the fins 205C-1 and 205C-2 were parts of a continuous fin before they are cut into the two separate segments. The cut process is self-aligned to the sides of the gate stacks 240-3 and 240-5, which results in vertical alignment between the ends of the fins 205C-1/205C-2 and the sides of the gate stacks 240-3/240-5. Specifically, the end of the fin 205C-1 interfacing with the isolation feature 229 is vertically aligned with a side (or an edge) of the gate stacks 240-3 (which is an interconnect gate (ICG) in the present embodiment). Also, the end of the fin 205C-2 interfacing with the isolation feature 229 is vertically aligned with a side (or an edge) of the gate stacks 240-5 (which is also an ICG in the present embodiment). The cut process results in a fin-cut trench (as indicated by the dashed box in FIG. 2B) between the two opposing ends of the fins 205C-1/205C-2. The spacer layer 247 is disposed over sidewalls of the gate stacks 240 and extends continuously through the fin-cut trench (by being disposed on the sidewalls and the bottom of the fin-cut trench). In other words, the spacer layer 247 on the sidewall of the gate stacks 240-3, in the fin-cut trench, and on the sidewall of the gate stack 240-5 are one continuous feature. The spacer layer 247 only partially fills the fin-cut trench. The ILD layer 270 (and optionally a CESL between the spacer layer 247 and the ILD 270) fills the remaining portion of the fin-cut trench, resulting in the isolation feature 229 having a portion of the spacer layer 247 and a portion of the ILD layer 270 (and optionally a portion of a CESL between the spacer layer 247 and the ILD 270). As shown in FIG. 2C, in this view, the isolation feature 229 spans from a sidewall of the isolation structure 230 to another, opposing sidewall of the isolation structure 230. The width of the isolation feature 229 (along the "x" direction) is about the same as the width of the fins 205 (particularly, the fins 205C-1 and 205C-2).

As shown in FIGS. 2B, 2C, and 2D, the device 200 further includes n-type doped source/drain features 260A disposed over the p-type doped regions 204A and the fins 205 for forming NMOSFET, and p-type doped source/drain features 260B disposed over the n-type doped regions 204B and fins 205 for forming PMOSFET. The source/drain features 260A and 260B may be formed using epitaxial growth. For example, a semiconductor material is epitaxially grown from portions of substrate 202 and fins 205, forming epitaxial source/drain features 260A and 260B. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or semiconductor fins 205. In some embodiments, the epitaxial source/drain features 260A may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the epitaxial source/drain features 260B may include silicon germanium or germanium and may be doped with boron, other p-type dopant, or combinations thereof (for example, forming Si:Ge:B epitaxial source/drain features). In some embodiments, epitaxial source/drain features 260A and/or 260B include more than one epitaxial semiconductor layer, where the epitaxial semiconductor layers can include the same or different materials and/or dopant concentrations. In some embodiments, epitaxial source/drain features 260A, 260B include materials and/or dopants that achieve desired tensile stress and/or compressive stress in respective channel regions of the transistors. In some embodiments, epitaxial source/drain features 260A, 260B are doped during deposition by adding impurities to a source material of the epitaxy process (i.e., in-situ). In some embodiments, epitaxial source/drain features 260A, 260B are doped by an ion implantation process subsequent to a deposition process. In some embodiments, annealing processes (e.g., rapid thermal annealing (RTA) and/or laser annealing) are performed to activate dopants in epitaxial source/drain features 260A, 260B and/or other source/drain regions (for example, heavily doped source/drain regions and/or lightly doped source/drain (LDD) regions). In some embodiments, epitaxial source/drain features 260A, 260B are formed in separate processing sequences that include, for example, masking p-type transistor regions when forming epitaxial source/drain features 260A in n-type transistor regions and masking n-type transistor regions when forming epitaxial source/drain features 260B in p-type transistor regions.

As shown in FIG. 2E, in embodiments where the device 200 is a FinFET device (i.e., the transistors are FinFETs), the fins 205 serve as the transistor channels for the FinFET devices and connect the respective source/drain features 260A, 260B. The fins 205 may include single crystalline silicon. Alternatively, the fins 205 may comprise germanium, silicon germanium, or another suitable semiconductor material(s). The embodiment shown in FIG. 2B is also a FinFET device.

As shown in FIG. 2F, in embodiments where the device 200 is a GAA device (i.e., the transistors are GAA transistors), the device 200 further includes stacks of semiconductor layers 215 suspended between each pair of the source/drain features 260A and each pair of the source/drain features 260B. The stack of semiconductor layers 215 serve as the transistor channels for the GAA devices. Accordingly, the semiconductor layers 215 are also referred to as channel layers 215. The channel layers 215 may include single crystalline silicon. Alternatively, the channel layers 215 may comprise germanium, silicon germanium, or another suitable semiconductor material(s). Initially, the channel layers 215 are formed as part of the fins 205 that include the channel layers 215 and other semiconductor layers of a different material. During a gate replacement process, the fins 205 in the channel region are selectively etched to remove the other semiconductor layers, leaving the channel layers 215 suspended over the substrate 202 and between the respective source/drain features 260A, 260B. This is also referred to as a channel release process. For purpose of simplicity, the cross-sectional view for the GAA embodiment along the "Cross-section-1" line in FIG. 2A is not shown.

As shown in FIG. 2F, channel layers 215 for NMOSFET GAA transistors have a width W1 along the "x" direction and a thickness "T1" along the "z" direction, and channel layers 215 for PMOSFET GAA transistors have a width W2 along the "x" direction and a thickness "T2" along the "z" direction. In the depicted embodiment, thickness T1 is about equal to thickness T2, though the present disclosure contemplates embodiments where thickness T1 is different than thickness T2. In some embodiments, a ratio of width W1 to width W2 may be in a range of 1.1 to 4 to boost the NMOSFET performance, for example, for higher driving current. In some embodiments, a ratio of width W1 to thickness T1 may be in a range of 1 to 10 so that the shape of the channel layers 215 for the NMOSFET is like a rectangular bar or a sheet. In some embodiments, width W1 and/or width W2 is about 4 nm to about 60 nm. In some embodiments, the channel layers 215 may be cylindrical-shaped (e.g., nanowire), rectangular-shaped (e.g., nanobar), sheet-shaped (e.g., nanosheet), etc.), or have other suitable shapes.

Referring to FIGS. 2A, 2E, and 2F, some gate stacks 240, such as the gate stacks 240-2, 240-3, 240-5, and 240-8, connect (or straddle) a PMOSFET and an NMOSFET. Taking the gate stack 240-3 for example (see FIG. 2A), it engages the fin 205A to form a NMOSFET PD-1, engages the fin 205B to form a PMOSFET PU-1, and is disposed over an end of the fin 205C-1. Referring to FIG. 2B, the portion of fin 205C-1 directly under the gate stack 240-3 is not a transistor channel because it is sandwiched between the S/D feature 260B and the isolation feature 229, rather than between two S/D features. This part of the gate stack 240-3 serves as an interconnect, thus referred to as interconnect gate. Referring to FIGS. 2A and 2B, a butted contact 409 is disposed over the interconnect gate and the S/D contact 406, thereby electrically connecting the S/D feature 260B to the gate stack 240-3.

As shown in FIGS. 2B, 2E, and 2F, each gate stack 240 includes a gate electrode layer 350 disposed over a gate dielectric layer 282. In the FinFET embodiment (FIG. 2E), the gate electrode layer 350 and the gate dielectric layer 282 are disposed over top and sidewalls of an upper portion of the fins 205, while the lower portion of the fins 205 are isolated by the isolation structure 230. In some further embodiments, the gate stack 240 further includes an interfacial layer (such as having silicon dioxide, silicon oxynitride, or other suitable materials) between the gate dielectric layer 282 and the fins 205. In the GAA embodiment (FIG. 2F), the gate electrode layer 350 and the gate dielectric layer 282 wrap around each of the semiconductor layers 215. In some further embodiments, the gate stack 240 further includes an interfacial layer (such as having silicon dioxide, silicon oxynitride, or other suitable materials) between the gate dielectric layer 282 and the channel layers 215. The gate dielectric layer 282 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate dielectric layer 282 may be formed by chemical oxidation, thermal oxidation, atomic layer deposition (ALD), chemical vapor deposition (CVD), and/or other suitable methods. In some embodiments, the gate electrode layer 350 includes an n-type work function layer for NMOSFET device or a p-type work function layer for PMOSFET device and further includes a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer 350 may be formed by CVD, PVD, plating, and/or other suitable processes. Since the gate stack 240 includes a high-k dielectric layer and metal layer(s), it is also referred to as a high-k metal gate.

As shown in FIG. 2B, the device 200 includes gate spacers 247 on sidewalls of the gate stacks 240 and above the fins 205. The gate spacers 247 are formed by any suitable process and include a dielectric material such as silicon oxide, silicon nitride, silicon oxynitride (SiON), silicon carbide, silicon carbon nitride (SiCN), silicon oxycarbide (SiOC), silicon oxycarbon nitride (SiOCN), carbon doped oxide, nitrogen doped oxide, porous oxide, air gap, or a combination thereof. For example, a dielectric layer including silicon and nitrogen, such as a silicon nitride layer, can be deposited over the gate stacks 240 and subsequently etched (e.g., anisotropically etched) to form gate spacers 247. In some embodiments, gate spacers 247 include a multi-layer structure, such as a first dielectric layer that includes silicon nitride and a second dielectric layer that includes silicon oxide. In some embodiments, more than one set of spacers, such as seal spacers, offset spacers, sacrificial spacers, dummy spacers, and/or main spacers, are formed adjacent to the gate stacks 240. In such implementations, the various sets of spacers can include materials having different etch rates. For example, a first dielectric layer including silicon and oxygen (e.g., silicon oxide) can be deposited and etched to form a first spacer set adjacent to the gate stacks 240, and a second dielectric layer including silicon and nitrogen (e.g., silicon nitride) can be deposited and etched to form a second spacer set adjacent to the first spacer set.

As shown in FIGS. 2E and 2F, the device 200 further includes gate-end dielectric features 404 that are disposed between an end of a gate stack 240 and an end of another gate stack 240. In an embodiment, the gate-end dielectric features 404 include a high-k material, such as selected from a group consisting of $Si_3N_4$, nitrogen-containing oxide, carbon-containing oxide, dielectric metal oxide such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), hafnium dioxide-alumina ($HfO_2$—$Al_2O_3$) alloy, other suitable high-k dielectric material, or combinations thereof.

As shown in FIG. 2B, the device 200 further includes a gate-top dielectric layer 408 that is disposed over each of the gate stacks 240. In an embodiment, the thickness of the gate-top dielectric layer 408 is in a range of about 2 nm to about 60 nm. The gate-top dielectric layer 408 may include a material selected from the group consisting of silicon oxide, SiOC, SiON, SiOCN, nitride base dielectric, dielectric metal oxide such as Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof. The gate-top dielectric layer 408 may be formed by recessing the gate stacks 240 and the gate spacers 247 to form trenches, fill the trenches with one or more dielectric materials, and performing a CMP process to remove excessive dielectric materials.

As shown in FIGS. 2B, 2C, and 2D, the device 200 further includes source/drain (S/D) contacts 406 over the source/drain features 260A and 260B. Even though not illustrated, the device 200 further includes a silicide feature between the source/drain contacts 406 and the source/drain features 260A and 260B. The silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In an embodiment, the S/D contacts 406 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the S/D contacts 406. Some of the S/D contacts 406 (such as shown in FIG. 2D) connect multiple S/D features 260A/B and are referred to as long contact in some instances.

As shown in FIGS. 2B, 2C, and 2D, the device 200 further includes an inter-layer dielectric (ILD) layer 270. The ILD layer 270 is disposed over the isolation structure 230, the S/D features 260A/B, the S/D contacts 406, the gate stacks 240, the gate spacers 247, and the gate-top dielectric layer 408. In some embodiments, the device 200 further includes a contact etch stop layer (CESL) between the ILD layer 270 and the S/D features 260A/B, the gate stacks 240, and the top spacers 247. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

As shown in FIGS. 2A-2F, the device 200 further includes gate vias 410 that are electrically connected to the gate stacks 240, S/D contact vias 412 that are electrically connected to the S/D contacts 406, and butted contacts 409 that electrically connect the S/D contacts 406 to the interconnect gates (ICG). Each of the gate vias 410, S/D contact vias 412, and butted contacts 409 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), or other metals, and may be formed by CVD, PVD, ALD, plating, or other suitable processes. In some embodiments, the conductive barrier layer is omitted in the via.

The second embodiment of the present disclosure is described by referring to FIGS. 2G, 2H, 2D, 2E, and 2F. The features of the FIGS. 2D, 2E, and 2F have been described in the First Embodiment, which are incorporated herein. Referring to FIG. 2G, the isolation feature 229 in this embodiment is also disposed between an end of a fin 205 (such as the fin 205C-1) and another, opposing, end of anther fin 205 (such as the fin 205C-2) along the "y" direction. The two ends of the fins 205 face each other along the "y" direction across a fin-cut trench as indicated by the dashed box. The isolation feature 229 includes a dielectric feature 231 and a portion of the ILD 270. Even though not shown in FIG. 2G, the device 200 may include a CESL under the ILD 270 in an embodiment. To further such embodiment, the isolation feature 229 includes a portion of the CESL between the dielectric feature 231 and the ILD 270. The dielectric feature 231 is disposed on sidewalls and bottom surface of the fin-cut trench. The dielectric feature 231, the ILD 270, and the optional CESL collectively completely fill the fin-cut trench. The gate spacers 247 do not extend into the fin-cut trench in this embodiment. The ends of the fins 205C-1 and 205C-2 may or may not be vertically aligned with the sides of the gate stacks 240-3 and 240-5, like in the First Embodiment. Instead, the ends of the fins 205C-1 and 205C-2 may be directly under the gate spacers 247. The sidewalls of the dielectric feature 231 that interface with the ILD 270 (or the optional CESL) are substantially aligned (vertically) with the sides of the gate spacers 247 that interface with the ILD 270 (or the optional CESL). Also, the dielectric feature 231 laterally extends (along the "y" direction) to areas directly under the gate spacers 247 by a distance E1. In the present embodiment, the dielectric feature 231 includes a material that is different from that of the gate spacers 247 and different from that of the isolation structure 230. For example, the dielectric feature 231 includes a nitrogen-comprising dielectric, such as silicon nitride, silicon carbonitride, silicon oxy carbonitride, or other dielectric material(s) containing nitrogen. Referring to FIG. 2H, the isolation feature 229 in this embodiment is also disposed between a sidewall of the isolation structure 230 and another, opposing, sidewall of the isolation structure 230 along the "x" direction. Similar to the discussion of FIG. 2C, the isolation feature 229 extends a depth (or height) D2 below the top surface of the isolation structure 230. In an embodiment, the depth D2 is greater than the thickness D3 of the isolation structure 230 to ensure that the ends of the fins 205C-1 and 205C-2 are completely isolated from each other by the isolation feature 229. Also, the ILD layer 270 extends a depth D1 below the top surface of the isolation structure 230. In some embodiments, the depth D1 is in a range of about 5 nm to about 35 nm.

The third embodiment of the present disclosure is described by referring to FIGS. 2I, 2H, 2D, 2E, and 2F. The features of the FIGS. 2H, 2D, 2E, and 2F have been described in the First and Second Embodiments, which are incorporated herein. Referring to FIG. 2I, the isolation feature 229 in this embodiment is also disposed between two ends of fins 205 (such as the fins 205C-1 and 205C-2) that face each other along the "y" direction across a fin-cut trench as indicated by the dashed box. The isolation feature 229 includes a dielectric feature 231 and a portion of the ILD 270. Even though not shown in FIG. 2I, the device 200 may include a CESL under the ILD 270 in a further embodiment. To further such embodiment, the isolation feature 229 includes a portion of the CESL between the dielectric feature 231 and the ILD 270. The dielectric feature 231 is disposed on sidewalls and bottom surface of the fin-cut trench, as well as on sidewalls of the gate spacers 247. In some embodiments, the dielectric feature 231 is considered part of the gate spacers 247. The dielectric feature 231, the ILD 270, and the optional CESL collectively completely fill the fin-cut trench. The gate spacers 247 do not extend into the fin-cut trench in this embodiment. The ends of the fins 205C-1 and 205C-2 may or may not be vertically aligned with the sides of the gate stacks 240-3 and 240-5, like in the First Embodiment. Instead, the ends of the fins 205C-1 and 205C-2 may be directly under the gate spacers 247. The dielectric feature 231 laterally extends (along the "y" direction) to areas directly under the gate spacers 247 by a distance E1 from the sidewalls of the gate spacers 247. In some embodiments, this lateral extension E1 is about 2 nm to about 6 nm. In the present embodiment, the dielectric feature 231 includes a material that is different from that of the gate spacers 247 and different from that of the isolation structure 230. For example, the dielectric feature 231 includes a nitrogen-comprising dielectric, such as silicon nitride, silicon carbonitride, silicon oxy carbonitride, or other dielectric material(s) containing nitrogen.

Figure 3:
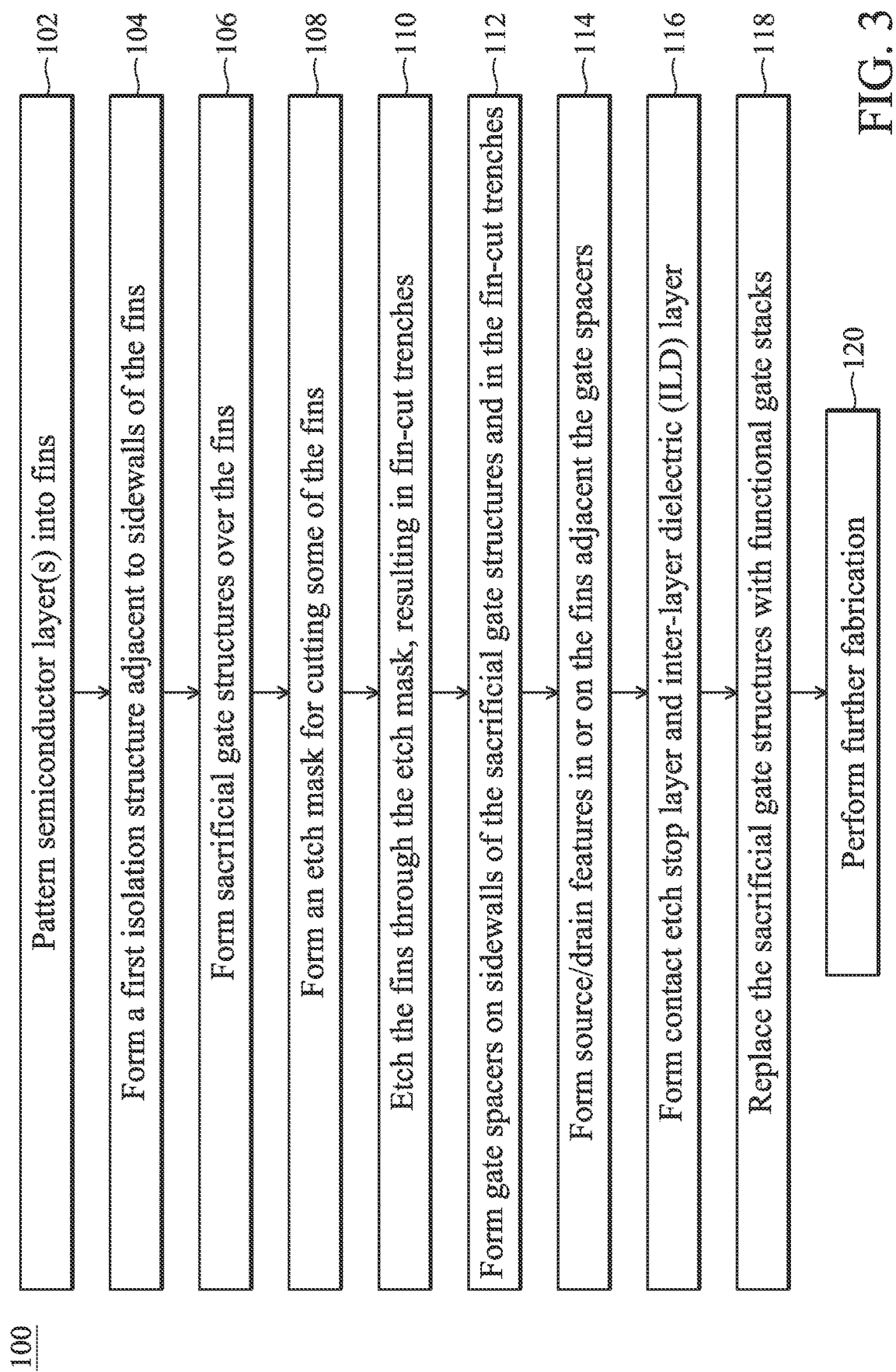

FIG. 3 shows a flow chart of a method 100 for fabricating a semiconductor device, such as the device 200, according to various aspects of the present disclosure. Particularly, an embodiment of the method 100 may be used for fabricating the embodiment of the device 200 as illustrated in FIGS. 2A, 2B, 2C, 2D, and 2F (GAA transistor). The method 100 may also be used for fabricating the embodiment of the device 200 as illustrated in FIGS. 2A, 2B, 2C, 2D, and 2E (FinFET), other variations of the device 200, or other devices. Method 100 is briefly described below in conjunction with FIGS. 4-16C. Additional processing is contemplated by the present disclosure. Additional steps can be provided before, during, and after method 100, and some of the steps described can be moved, replaced, or eliminated for additional embodiments of method 100.

At operation 102, the method 100 (FIG. 3) forms a semiconductor layer stack over a substrate and patterns the semiconductor layer stack into fins. Referring to FIG. 4, substrate 202 is provided and includes the active regions 204A and 204B. Referring to FIG. 5, a semiconductor layer stack 203 includes semiconductor layers 210 and semiconductor layers 215 stacked vertically in an alternating or interleaving configuration from a surface of the substrate 202. The topmost semiconductor layer 215 is labeled as 215a for convenience of discussion. In some embodiments, semiconductor layers 210 and semiconductor layers 215 are epitaxially grown in the depicted interleaving and alternating configuration. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. For example, semiconductor layers 210 and semiconductor layers 215 may include different materials, constituent atomic percentages, constituent weight percentages, thicknesses, and/or other characteristics to achieve desired etching selectivity during an etching process, such as an etching process implemented to form suspended channel layers in channel regions of the device 200. For example, where semiconductor layers 210 include silicon germanium and semiconductor layers 215 include silicon, a silicon etch rate of semiconductor layers 215 is less than a silicon germanium etch rate of semiconductor layers 210. For another example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein.

The semiconductor layers 215 or portions thereof form channel regions of the device 200. In the depicted embodiment, semiconductor layer stack 203 includes three semiconductor layers 210 and three semiconductor layers 215 configured to form three semiconductor layer pairs disposed over substrate 202, each semiconductor layer pair having a respective semiconductor layer 210 and a respective semiconductor layer 215. After undergoing subsequent processing, such configuration will result in the (GAA) device 200 having three channels. However, the present disclosure contemplates embodiments where semiconductor layer stack 203 includes more or less semiconductor layers, for example, depending on a number of channels desired for the device 200 (e.g., a GAA transistor) and/or design requirements of the device 200. For example, semiconductor layer stack 203 can include two to ten semiconductor layers 210 and two to ten semiconductor layers 215. In some embodiment, semiconductor layers 210 have a thickness about 4 nm to about 15 nm per layer and semiconductor layers 215 have a thickness about 4 nm to about 10 nm per layer, where the thicknesses are chosen based on fabrication and/or device performance considerations for the device 200. FIG. 5 also shows a hard mask layer 416 over the semiconductor layer stack 203 for protecting the semiconductor layer stack 203 during subsequent patterning process(es).

Subsequently, the operation 102 patterns the semiconductor layer stack 203 into fins 211 and the active regions 204A/B into fins 205, such as shown in FIGS. 6A and 6B. FIG. 6A shows a schematic top view of the fins 211 and 205, while FIG. 6B shows a schematic cross-sectional view of two fins 211 and 205. The fins 211 are elongated continuous pieces that are oriented lengthwise along the "y" direction. The fins 211 are not separated for individual transistors or circuits. The fins 211 and 205 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the semiconductor layer stack 203 and is patterned using a photolithography process. Spacers are formed alongside the patterned sacrificial layer (referred to as mandrel patterns) using a self-aligned process. The sacrificial layer is then removed, and the remaining spacers may then be used as a masking element for patterning the fins. For example, the masking element may be used for etching recesses into the semiconductor layer stack 203 and the substrate 202, resulting in the fins 211, 205A, and 205B. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins may be suitable.

At operation 104, the method 100 (FIG. 3) forms the isolation structure 230, such as shown in FIGS. 7A and 7B. FIG. 7A shows a top view of the device 200, while FIG. 7B shows a cross-sectional view of the device 200 (showing only two fins 211). The isolation structure 230 may be STI or other types of isolation that are generally silicon-oxide based. Due to the different thermal expansion coefficients between silicon (in the fins 211) and STI (in the isolation structure 230), there exists biaxial compressive residual stress in the fins 211. Such STI-induced stress generally increases PMOS current and decrease NMOS current, thus may result in unbalanced CMOS circuits. It has been found that STI-induced stress generally relaxes exponentially with increased distance from silicon/STI boundary. In other words, the middle section of the fins 211 are subject to much lower STI-induced stress than the ends of the fins. In the present embodiment, the fins 211 are elongated and continuous pieces at this fabrication stage, without being separated for individual transistors or circuits. Thus, the stress in the fins 211 induced by the isolation structure 230 is approximately uniform (and is very small) in the circuit region 213 as indicated by the dashed box in FIG. 7A, while the stress may be exponentially increased outside the circuit region 213 (i.e., at or near the ends of the fins 211). For example, the SRAM macro 201 (FIG. 1A) may be entirely formed in the circuit region 213. In approaches where the fins 211 have been separated for individual circuits before the isolation structure 230 is formed, the ends of some fins are exposed to the isolation structure 230 within the circuit region 213. Those fins might suffer from non-uniform STI-induced stress, and transistors formed in or on those fins might suffer from unbalanced CMOS performance. Comparatively, in the present disclosure, the fins 211 are separated (or cut) into segments for individual circuits in a fabrication stage after the isolation structure 230 is formed, thus reducing such non-uniformity within the circuit region. The isolation structure 230 can be formed by filling the trenches between the fins 211 with an insulator material, for example, by using a CVD process or a spin-on glass process. A chemical mechanical polishing (CMP) process may be performed to remove excessive insulator material and/or planarize a top surface of isolation features 230. Then an etching back process is performed to recess the isolation features 230 to a desired thickness, such as surrounding a lower portion of the fins and leaving an upper portion of the fins (particularly, the fins 211) protruding above the isolation features 230. In an embodiment, the hard mask layer 416 is removed during the CMP process or the etching back process.

At operation 106, the method 100 (FIG. 3) forms sacrificial gate stacks 240' over the fins 211. Each sacrificial gate stack 240' includes a sacrificial gate dielectric layer 246 and a sacrificial gate electrode layer 245. FIG. 8A shows a top view of the device 200 with fins 211 oriented lengthwise along the "y" direction and gate stacks 240' oriented lengthwise along the "x" direction. The gate stacks 240' are formed uniformly and densely in the device 200 to benefit S/D formation in a subsequent fabrication stage and to reduce S/D layout dependent effect, which refers to a phenomenon where S/D in dense gate areas and S/D in isolated gate areas have different performances such as different mobility enhancement factors. FIG. 8B is a cross-sectional view of the device 200, in portion, along a widthwise direction of the fins 211 (i.e., "x" direction), and FIG. 8C is a cross-sectional view of the device 200, in portion, along a lengthwise direction of the fins 211 (i.e., "y" direction). The sacrificial gate dielectric layer 246 is formed on top and sidewalls of the fins 211 and the sacrificial gate electrode layer 245 is formed on the sacrificial gate dielectric layer 246. In embodiments, the sacrificial gate dielectric layer 246 may include a dielectric material, such as silicon oxide, silicon oxynitride, a high-k dielectric material, other suitable dielectric material, or combinations thereof; and the sacrificial gate electrode layer 245 includes a suitable dummy gate material, such as polysilicon layer. The sacrificial gate electrode layer 245 and the sacrificial gate dielectric layer 246 may be deposited using CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. Further, the operation 106 may perform lithography patterning and etching process to pattern the sacrificial gate electrode layer 245 and the sacrificial gate dielectric layer 246 into the individual sacrificial gate stacks 240'. The lithography patterning processes include resist coating (for example, spin-on coating), soft baking, mask aligning, exposure, post-exposure baking, developing the resist, rinsing, drying (for example, hard baking), other suitable lithography processes, or combinations thereof. The etching processes include dry etching processes, wet etching processes, other etching methods, or combinations thereof.

At operation 108, the method 100 (FIG. 3) forms an etch mask 241 over the device 200, such as shown in FIGS. 9A, 9B, and 9C. FIG. 9A is a top view of the device 200, in portion, and FIGS. 9B and 9C are cross-sectional views of the device 200, in portion, along the "Cross-section-H" line and the "Cross-section-V" line of the FIG. 9A, respectively. The etch mask 241 provides openings 238 that expose some portions of the fins 211. The etch mask 241 may be formed using photolithography process and may include a photoresist. The etch mask 241 may additionally include an anti-reflective coating layer under the photoresist. The etch mask 241 is used to cut the fins 211 into segments for individual circuits or transistors. For example, the cut patterns 502 shown in FIG. 2A correspond to such openings 238. Each opening 238 overlaps with two sacrificial gate stacks 240' along the "y" direction and overlaps with the isolation structure 230 along the "x" direction. A segment of the fin 211 along with some portions of the sacrificial gate stacks 240' and the isolation structure 230 are exposed through the opening 238. As will be discussed, the segment of the fin 211 will be etched using a selective etching process that is tuned to be selective to the material of the fin 211 with no (or minimal) etching to the sacrificial gate stacks 240' and the isolation structure 230. Thus, the opening 238 can be designed to overlap with the sacrificial gate stacks 240' and the isolation structure 230 to increase lithography process margin.

At operation 110, the method 100 (FIG. 3) etches the segment(s) of the fins 211 that are exposed through the openings 238, such as shown in FIGS. 10A, 10B, and 10C. FIG. 10A is a top view of the device 200, in portion, and FIGS. 10B and 10C are cross-sectional views of the device 200, in portion, along the "Cross-section-H" line and the "Cross-section-V" line of the FIG. 10A, respectively. In the depicted embodiment, an etching process completely removes the semiconductor layer stack 203 and the active regions 204A/B of fins 211 thereby exposing the substrate 202 through the openings 238. In some alternative embodiments, the etching process completely removes the semiconductor layer stack 203 and partially removes the active regions 204A/B of fins 211. The operation 110 produces fin-cut trench(es) 253 between two opposing ends of the fins. As shown in FIGS. 10A and 10C, the fin-cut trench 253 extends from an edge of a gate stack 240' to an edge of another, adjacent, gate stack 240' along the "y" direction. The ends of the fins 211 are substantially vertically aligned with the edges of the gate stacks 240' in this embodiment where anisotropic etching is applied. In some embodiments where isotropic etching is applied (alone or in addition to anisotropic etching), the ends of the fins 211 may be directly under, instead of being vertically aligned with, the gate stacks 240'. As shown in FIGS. 10A and 10B, the fin-cut trench 253 extends from a sidewall to another, opposing, sidewall of the isolation structure along the "x" direction and extends below a bottom surface of the isolation structure 230. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In the present embodiment, parameters of the etching process are configured to selectively etch semiconductor layer stack with minimal (to no) etching of the gate stacks 240' and the isolation structure 230. Therefore, the etching of the fins 211 are self-aligned to the edges of the gate stacks 240' and to the sidewalls of the isolation structure 230. The self-aligned etching process improves the process margin for the fin-cut process. Further, the remaining portions of the fins 211 have substantially uniform extension (or length) under the gate stacks 240'. This uniformity improves the S/D formation process in a later fabrication stage. This has advantages over other approaches where the fins are cut before the gate stacks 240' are formed. In those approaches, the process margin for forming the gate stacks is narrower than the present disclosure since the gate stacks have to cover the ends of the fins and the process margin is thus impacted by lithography overlay shift. Also, the length of the fins under the gate stacks in those approaches may not be as uniform as in the present disclosure due to lithography overlay shift. After the etching is completed, the etch mask 241 is removed, using resist stripping, ashing, and/or other methods. The resultant structure is shown in FIGS. 11A, 11B, and 11C. FIG. 11A is a top view of the device 200, in portion, and FIGS. 11B and 11C are cross-sectional views of the device 200, in portion, along the "Cross-section-H" line and the "Cross-section-V" line of the FIG. 11A, respectively.

At operation 112, the method 100 (FIG. 3) forms a gate spacer layer (or gate spacers) 247 over sidewalls of the gate stack 240' as well as in the trenches 253, such as shown in FIGS. 12A, 12B, and 12C. FIG. 12A is a top view of the device 200, in portion, and FIGS. 12B and 12C are cross-sectional views of the device 200, in portion, along the "Cross-section-H" line and the "Cross-section-V" line of the FIG. 12A, respectively. As shown in FIG. 12C, the gate spacer layer 247 extends continuously from a sidewall of a gate stack 240', through the fin-cut trench 253, and to a sidewall of another gate stack 240'. The gate spacer layer 247 is disposed over the sidewalls and the bottom of the fin-cut trench 253 without completely filling the fin-cut trench 253. As shown in FIG. 12B, the gate spacer layer 247 extends below a bottom surface of the isolation structure 230, while a top surface of the gate spacer layer 247 within the fin-cut trench 253 is below the top surface of the isolation structure 230. The materials and configuration of the gate spacer layer 247 have been discussed with reference to FIG. 2B. For example, the gate spacers 247 may include a dielectric material such as silicon oxide, silicon nitride, silicon oxynitride (SiON), silicon carbide, silicon carbon nitride (SiCN), silicon oxycarbide (SiOC), silicon oxycarbon nitride (SiOCN), carbon doped oxide, nitrogen doped oxide, porous oxide, air gap, or a combination thereof. For example, a dielectric layer can be deposited over the gate stacks 240' and subsequently etched (e.g., anisotropically etched) to form the gate spacer layer 247.

Figure 13A:
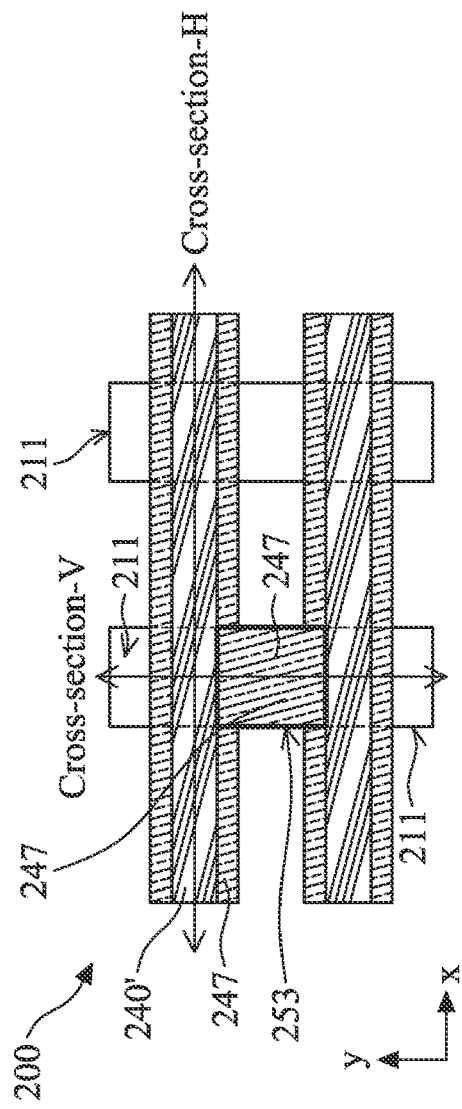
Figure 13B:
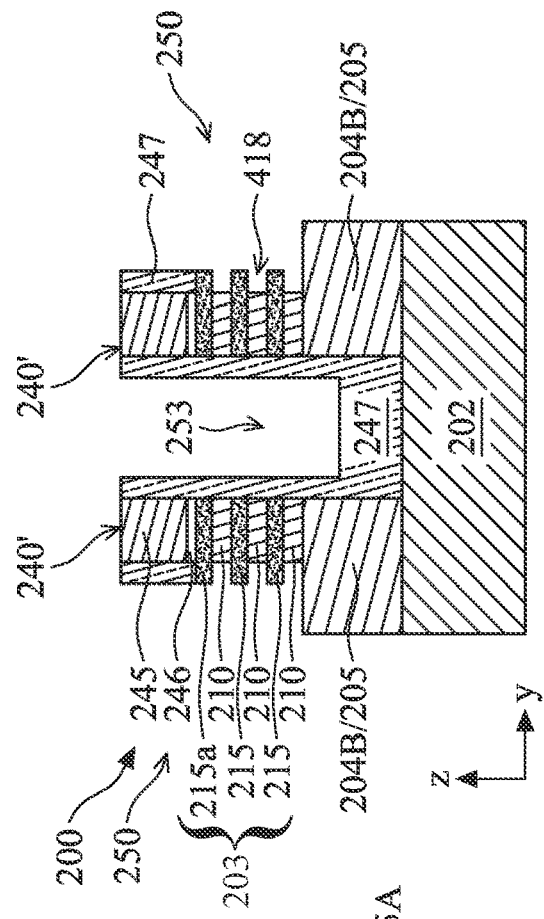
Figure 13C:
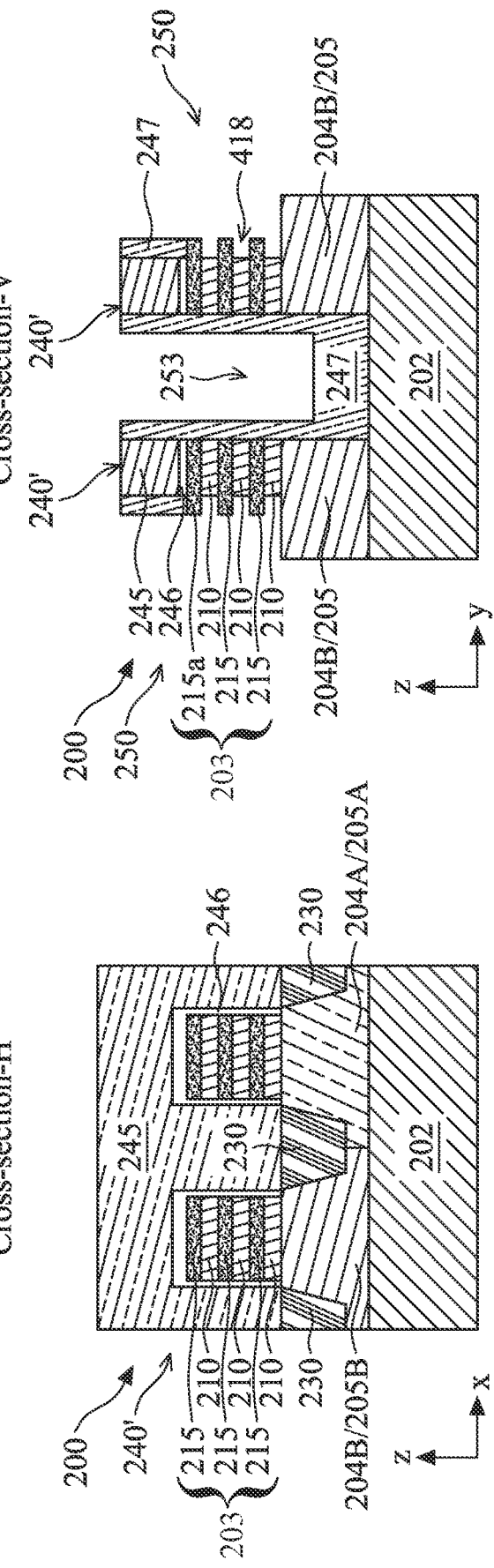

At operation 114, the method 100 (FIG. 3) forms S/D features 260 in or on the fins 205 adjacent the gate spacers 247. This may involve multiple processes including etching S/D trenches, forming inner spacer, and epitaxially growing S/D features. For example, the operation 114 etches the fins 211 adjacent the gate spacers 247 to form S/D trenches (or recesses) 250, such as shown in FIGS. 13A, 13B, and 13C. FIG. 13A is a top view of the device 200, in portion, and FIGS. 13B and 13C are cross-sectional views of the device 200, in portion, along the "Cross-section-H" line and the "Cross-section-V" line of the FIG. 13A, respectively. In the depicted embodiment, an etching process completely removes semiconductor layer stack 203 in source/drain regions of fins 211 thereby exposing the substrate portion 204A/B in the source/drain regions. In some embodiments, the etching process removes some, but not all, of semiconductor layer stack 203, such that source/drain trenches 250 have bottoms defined by semiconductor layer 210 or semiconductor layer 215 in source/drain regions. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of the gate stacks 240', the gate spacers 247, and the isolation structure 230.

Then, the operation 114 forms gaps 418 between the semiconductor layers 215. For example, an etching process is performed that selectively etches semiconductor layers 210 exposed by source/drain trenches 250 with minimal (to no) etching of semiconductor layers 215, such that gaps 418 are formed between semiconductor layers 215 and between semiconductor layers 215 and substrate 202 under the gate spacers 247. The etching process may be a dry etching process, a wet etching process, other suitable etching process, or combinations thereof.

Then, the operation 114 forms the inner spacers 255 in the gaps 418 and epitaxially grows the S/D features 260A/B, such as shown in FIGS. 14A, 14B, and 14C. FIG. 14A is a top view of the device 200, in portion, and FIGS. 14B and 14C are cross-sectional views of the device 200, in portion, along the "Cross-section-H" line and the "Cross-section-V" line of the FIG. 14A, respectively. For example, a deposition process forms a spacer layer over the gate stacks 240' and over features defining source/drain trenches 250. The deposition process may be CVD, PVD, ALD, other suitable methods, or combinations thereof. The spacer layer partially (and, in some embodiments, completely) fills the source/drain trenches 250. The deposition process is configured to ensure that the spacer layer fills the gaps 418. An etching process is then performed that selectively etches the spacer layer to form inner spacers 255 as depicted in FIG. 14C with minimal (to no) etching of semiconductor layers 215, gate stacks 240', and gate spacers 247. The spacer layer (and thus inner spacers 255) includes a material that is different than a material of semiconductor layers 215 and a material of gate spacers 247 to achieve desired etching selectivity during the second etching process. Then, the operation 114 forms the S/D features 260A and 260B using epitaxial growth processes. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202, the semiconductor fins 205, and the semiconductor layers 215. The operation 114 may dope the S/D features 260A and 260B in-situ or ex-situ as discussed earlier.

At operation 116, the method 100 (FIG. 3) forms a CESL 269 over the S/D features 260A and 260B and the gate stacks 240' and form the ILD layer 270 over the CESL 269, such as shown in FIGS. 15A, 15B, and 15C. FIG. 15A is a top view of the device 200, in portion, and FIGS. 15B and 15C are cross-sectional views of the device 200, in portion, along the "Cross-section-H" line and the "Cross-section-V" line of the FIG. 15A, respectively. As shown in FIG. 15C, a portion of the CESL 269 and a portion of the ILD layer 270 are also disposed into the fin-cut trench 253. The portions of the CESL 269, the ILD layer 270, and the gate spacers 247 collectively form the isolation feature 229. The CESL 269 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

At operation 118, the method 100 (FIG. 3) replaces the sacrificial gate stacks 240' with functional gate stacks 240, such as shown in FIGS. 16A, 16B, and 16C. The gate stacks 240 include the gate electrode layer 350 over the gate dielectric layer 282. FIG. 16A is a top view of the device 200, in portion, and FIGS. 16B and 16C are cross-sectional views of the device 200, in portion, along the "Cross-section-H" line and the "Cross-section-V" line of the FIG. 16A, respectively. For example, the operation 118 first removes the gate stacks 240' to form gate trenches that expose semiconductor layers 215 and semiconductor layers 210 in channel regions. The etching process(es) may include a dry etching process, a wet etching process, other suitable etching process, or combinations thereof. In some embodiments, the etching processes are configured to selectively the sacrificial gate structures 240' with minimal (to no) etching of other features of the device 200, such as ILD layer 270, gate spacers 247, isolation structure 230, semiconductor layers 215, and semiconductor layers 210. Then, the operation 118 removes the semiconductor layers 210 using an etching process that selectively etches semiconductor layers 210 with minimal (to no) etching of semiconductor layers 215 and, in some embodiments, minimal (to no) etching of gate spacers 247 and/or inner spacers 255. The etching process may include a dry etching process, a wet etching process, other suitable etching process, or combinations thereof. As a result, the semiconductor layers 215 are suspended in the gate trenches. This process is also referred to as a channel release process. In processes for making FinFETs (such as shown in FIG. 2E), the channel release process is omitted in the method 100. Subsequently, the operation 118 forms the high-k metal gates 240 in the gate trenches. For example, the operation 118 may form the gate dielectric layer 282 using chemical oxidation, thermal oxidation, atomic layer deposition (ALD), chemical vapor deposition (CVD), and/or other suitable methods, and may form the gate electrode 350 using ALD, CVD, PVD, plating, and/or other suitable processes.

At operation 120, the method 100 (FIG. 3) performs further fabrication processes to the device 200, such as forming the gate end dielectric 404, the gate top dielectric 408, S/D contacts 406, gate vias 410, butted contacts 409, and S/D contact vias 412, and so on.

Figure 17:
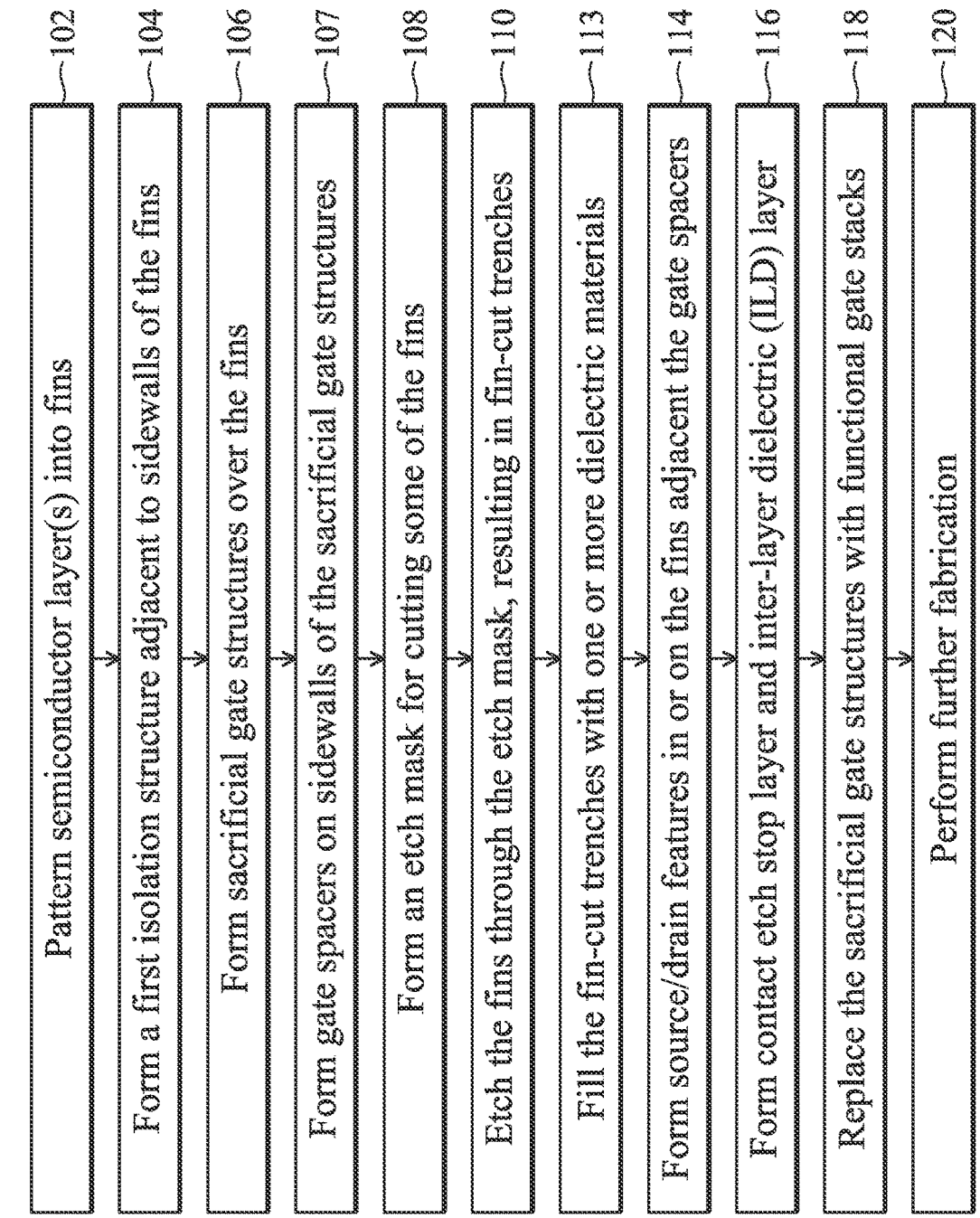

FIG. 17 shows a flow chart of a method 150 for fabricating a semiconductor device, such as the device 200, according to various aspects of the present disclosure. Particularly, an embodiment of the method 150 may be used for fabricating the embodiment of the device 200 as illustrated in FIGS. 2A, 2G, 2H, 2D, and 2F (GAA transistor). The method 150 may also be used for fabricating the embodiment of the device 200 as illustrated in FIGS. 2A, 2G, 2H, 2D, and 2E (FinFET), other variations of the device 200, or other devices. Method 150 is briefly described below in conjunction with FIGS. 18A-25C. Additional processing is contemplated by the present disclosure. Additional steps can be provided before, during, and after method 150, and some of the steps described can be moved, replaced, or eliminated for additional embodiments of method 150.

The method 150 includes operations 102, 104, and 106, which are the same as or substantially similar to those operations in the method 100 discussed above. The details of these operations are omitted for simplicity. After forming the sacrificial gate stacks 240' at the operation 106 (see FIGS. 9A, 9B, and 9C), the method 150 proceeds to operation 107. At the operation 107, the method 150 (FIG. 17) forms gate spacers 247 on sidewalls of the sacrificial gate stacks 240', such as shown in FIGS. 18A, 18B, and 18C. FIG. 18A is a top view of the device 200, in portion, and FIGS. 18B and 18C are cross-sectional views of the device 200, in portion, along the "Cross-section-H" line and the "Cross-section-V" line of the FIG. 18A, respectively. In the method 150, the fins 211 have not been cut at this fabrication stage. Thus, the gate spacers 247 are not deposited into the fin-cut trenches. Rather, the gate spacers 247 are deposited on top and sidewalls of the fins 211. Other aspects of the formation of the gate spacers 247 are the same as in the operation 112.

At the operation 108, the method 150 (FIG. 17) forms the etch mask 241 over the device 200, such as shown in FIGS. 19A, 19B, and 19C. FIG. 19A is a top view of the device 200, in portion, and FIGS. 19B and 19C are cross-sectional views of the device 200, in portion, along the "Cross-section-H" line and the "Cross-section-V" line of the FIG. 19A, respectively. This operation is substantially similar to the operation 108 for the method 100 discussed above. Here, each opening 238 overlaps with two sacrificial gate stacks 240' along the "y" direction and overlaps with the isolation structure 230 along the "x" direction. Alternatively, each opening 238 may overlap with two gate spacers 247 or one sacrificial gate stack 240' and one gate spacer 247 along the "y" direction.

At operation 110, the method 150 (FIG. 17) etches the segment(s) of the fins 211 that are exposed through the openings 238, such as shown in FIGS. 20A, 20B, and 20C. FIG. 20A is a top view of the device 200, in portion, and FIGS. 20B and 20C are cross-sectional views of the device 200, in portion, along the "Cross-section-H" line and the "Cross-section-V" line of the FIG. 20A, respectively. In the depicted embodiment, an etching process completely removes the semiconductor layer stack 203 and the active regions 204A/B of fins 211 thereby exposing the substrate 202 through the openings 238. In some alternative embodiments, the etching process completely removes the semiconductor layer stack 203 and partially removes the active regions 204A/B of fins 211. The operation 110 includes both anisotropic (vertical) etching and isotropic (lateral) etching components in the present embodiment. The etching processes can include a dry etching process, a wet etching process, other suitable etching process, or combinations thereof. The operation 110 produces fin-cut trench(es) 253 between two opposing ends of the fins. As shown in FIGS. 20A and 20C, the ends of the fins 211 are directly under the gate spacers 247 or the gate stacks 240' and away from the edges of the gate spacers 247 by a distance E1. In some embodiments, this lateral extension E1 is about 2 nm to about 6 nm. This lateral withdrawal of the fin ends is produced by the isotropic etching component in the operation 110. In the present embodiment, parameters of the etching process are configured to selectively etch semiconductor layer stack with minimal (to no) etching of the gate stacks 240', the gate spacers 247, and the isolation structure 230. Therefore, the etching of the fins 211 are self-aligned to the edges of the gate spacers 247 (taking into account the lateral withdrawal E1 as discussed above) and to the sidewalls of the isolation structure 230. The self-aligned etching process improves the process margin for the fin-cut process. Further, the remaining portions of the fins 211 have substantially uniform extension (or length) under the gate stacks 240'. This uniformity improves the S/D formation process in a later fabrication stage. This has advantages over other approaches where the fins are cut before the gate stacks 240' are formed. In those approaches, the process margin for forming the gate stacks is narrower than the present disclosure since the gate stacks have to cover the ends of the fins and the process margin is thus impacted by lithography overlay shift. Also, the length of the fins under the gate stacks in those approaches may not be as uniform as in the present disclosure due to lithography overlay shift. After the etching is completed, the etch mask 241 is removed, using resist stripping, ashing, and/or other methods. The resultant structure is shown in FIGS. 21A, 21B, and 21C. FIG. 21A is a top view of the device 200, in portion, and FIGS. 21B and 21C are cross-sectional views of the device 200, in portion, along the "Cross-section-H" line and the "Cross-section-V" line of the FIG. 21A, respectively.

At operation 113, the method 150 (FIG. 17) fills one or more dielectric materials 231 into the fin-cut trenches 253. The resultant structure is shown in FIGS. 22A, 22B, and 22C. FIG. 22A is a top view of the device 200, in portion, and FIGS. 22B and 22C are cross-sectional views of the device 200, in portion, along the "Cross-section-H" line and the "Cross-section-V" line of the FIG. 22A, respectively. As shown in FIG. 22C, the sidewalls of the dielectric feature 231 that are exposed in the fin-cut trench 253 are substantially aligned (vertically) with the sides of the gate spacers 247. Also, the dielectric feature 231 laterally extends (along the "y" direction) to areas directly under the gate spacers 247 by a distance E1. In the present embodiment, the dielectric feature 231 includes a material that is different from that of the gate spacers 247 and different from that of the isolation structure 230. For example, the dielectric feature 231 includes a nitrogen-comprising dielectric, such as silicon nitride, silicon carbonitride, silicon oxy carbonitride, or other dielectric material(s) containing nitrogen. In an embodiment, the operation 113 first deposits one or more dielectric materials to fill the fin-cut trenches 253 and over the fins 211, the gate stacks 240', the gate spacers 247, and the isolation structure 230; and then performs an anisotropic etching to the one or more dielectric materials so that the top surface of the one or more dielectric materials becomes even with or slightly below the top surface of the isolation structure 230. Portions of the one or more dielectric materials remain on the sidewalls of the ends of the fins 211 below the gate spacers 247.

Then, the method 150 (FIG. 17) proceeds to operations 114, 116, 118, and 120, which are the same as or substantially similar to the operations 114, 116, 118, and 120 of the method 100 discussed above. The resultant structure, in portion, is shown in FIGS. 23A, 23B, and 23C. FIG. 23A is a top view of the device 200, in portion, and FIGS. 23B and 23C are cross-sectional views of the device 200, in portion, along the "Cross-section-H" line and the "Cross-section-V" line of the FIG. 23A, respectively. As shown in FIG. 23C, the isolation feature 229 in this embodiment includes the dielectric feature 231, a portion of the CESL 269, and a portion of the ILD layer 270.

In an alternative embodiment, at operation 113, the method 150 does not completely remove the dielectric feature 231 from the sidewalls of the gate spacers 247. Rather, a portion of the dielectric feature 231 remains on the sidewalls of the gate spacers 247 such as shown in FIGS. 24A, 24B, and 24C. FIG. 24A is a top view of the device 200, in portion, and FIGS. 24B and 24C are cross-sectional views of the device 200, in portion, along the "Cross-section-H" line and the "Cross-section-V" line of the FIG. 24A, respectively. As shown in FIG. 24C, the dielectric feature 231 is disposed over sidewalls of the gate spacers 247 as well as in the fin-cut trench 253. In other words, the dielectric feature 231 extends continuously from a sidewall of a gate spacer 247, through the fin-cut trench 253, and to a sidewall of another gate spacer 247. FIGS. 25A, 25B, and 25C show a resultant structure of the device 200 after the method 150 has completed the operation 114 through 120 in this alternative embodiment. FIG. 25A is a top view of the device 200, in portion, and FIGS. 25B and 25C are cross-sectional views of the device 200, in portion, along the "Cross-section-H" line and the "Cross-section-V" line of the FIG. 25A, respectively.

Figure 28A:
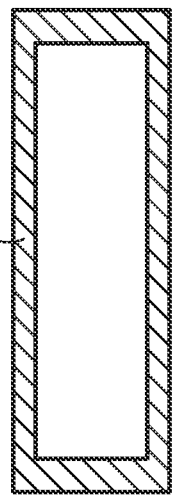
FIGS. 28A, 28B, 28C, and 28D are fragmentary diagrammatic top views of a semiconductor device, in portion, at various fabrication stages (such as those associated with the method in FIG. 26) according to various aspects of the present disclosure.
Figure 28C:
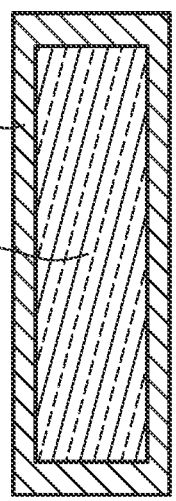
Figure 28B:
Figure 28D:
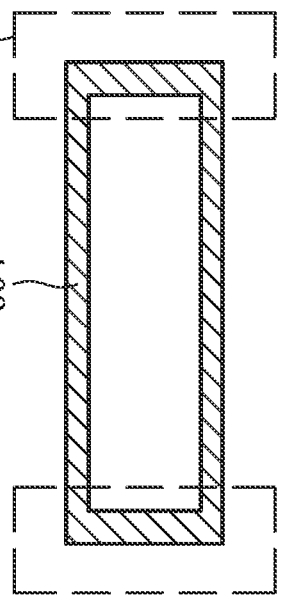

FIG. 26 shows a flow chart of the operation 102 for the methods 100 and 150, according to an embodiment. FIG. 26 is briefly discussed below in conjunction with FIGS. 27A-27D. Additional processing is contemplated by the present disclosure. Additional steps can be provided before, during, and after the steps shown in FIG. 26, and some of the steps described can be moved, replaced, or eliminated for additional embodiments. At step 130, the operation 102 forms mandrel patterns 602 (e.g., a dielectric material) over the semiconductor layer stack 203, such as shown in FIG. 27A. The mandrel patterns 602 may be formed using deposition, photolithography, and etching processes. At step 132, the operation 102 forms spacer patterns 604 over the semiconductor layer stack 203 and on sidewalls of the mandrel patterns. The spacer patterns 604 include a dielectric material different than that of the mandrel patterns 602. The spacer patterns 604 may be formed using deposition and etching processes such as anisotropic etching. At step 134, the operation 102 removes the mandrel patterns 602 and leaves the spacer patterns 604 over the semiconductor layer stack 203. At step 138, the operation 102 etches the semiconductor layer stack 203 using the spacer patterns 604 as an etch mask, thereby forming the fins 211, as discussed above. In some embodiment, the operation 102 further performs the step 136 between the steps 134 and 138. At step 136, the operation 102 cuts the spacer patterns 604, as explained below. In an embodiment, the spacer pattern 604 is initially formed (in the step 132) as a loop surrounding the mandrel pattern 602 in an embodiment as illustrated in FIG. 28A. After the mandrel pattern 602 is removed, the spacer pattern 604 is in the form of a loop as illustrated in FIG. 28B. Then, at step 136, the operation 102 forms an etch mask 606 that exposes the short edges of the spacer pattern 604 and covers the long edges of the spacer pattern 604, such as shown in FIG. 28C. Subsequently, the operation 102 etches the spacer pattern 604 through the etch mask 606 and cuts/removes the short edges of the spacer pattern 604. The resulting spacer patterns 604 are parallel elongate pieces, which are then used as an etch mask in the step 138.

Although not intended to be limiting, one or more embodiments of the present disclosure provide many benefits to a semiconductor device and the formation thereof. For example, embodiments of the present disclosure form isolation structures (such as STI) before performing a fin-cut process thereby reducing STI-induced stress to the active fins. Embodiments of the present disclosure perform a fin-cut process after sacrificial gate stacks are formed. The fin-cut process can be formed self-aligned to gate stacks or self-aligned to gate spacers. In either case, the present disclosure improves lithography process margin over approaches where the fin-cut process is performed before the gate stacks are formed. The present embodiments can be readily integrated into existing CMOS fabrication processes.

In one example aspect, the present disclosure is directed to a semiconductor structure that includes a substrate and first and second semiconductor fins extending from the substrate, wherein the first and the second semiconductor fins are lengthwise aligned along a first direction. The semiconductor structure further includes an isolation structure over the substrate and adjacent to sidewalls of the first and the second semiconductor fins and first and second gate structures that are oriented lengthwise along a second direction generally perpendicular to the first direction. The first and the second gate structures are disposed over the isolation structure. The first gate structure is disposed over the first semiconductor fin. The second gate structure is disposed over the second semiconductor fin. The semiconductor structure further includes a spacer layer that is disposed on a sidewall of the first gate structure and on a sidewall of the second gate structure and extends continuously through a trench between an end of the first semiconductor fin and an end of the second semiconductor fin.

In an embodiment of the semiconductor structure, the trench is substantially rectangular from a top view, and the end of the first semiconductor fin and the end of the second semiconductor fin form at least a portion of two opposing sidewalls of the trench. In a further embodiment, the spacer layer is disposed over the two opposing sidewalls of the trench and at bottom of the trench. In another further embodiment, sidewalls of the isolation structure form at least a portion of other two opposing sidewalls of the trench.

In an embodiment of the semiconductor structure, a top surface of a portion of the spacer layer within the trench is below a top surface of the isolation structure. In another embodiment, a portion of the spacer layer within the trench extends below a top surface of the substrate. In yet another embodiment, a side of the first gate structure is substantially aligned with the end of the first semiconductor fin from a top view. In a further embodiment, a side of the second gate structure is substantially aligned with the end of the second semiconductor fin from a top view.

In an embodiment, the semiconductor structure further includes an inter-layer dielectric layer that is disposed over the first and the second gate structures and fills in a portion of the trench. In another embodiment, the semiconductor structure further includes third and fourth gate structures that are parallel to each other and oriented lengthwise along the second direction, wherein the third and the fourth gate structures are disposed over the isolation structure, the third gate structure is disposed over a channel region of the first semiconductor fin, and the fourth gate structure is disposed over a channel region of the second semiconductor fin. In some embodiments, the semiconductor structure further includes a third semiconductor fin extending from the substrate, wherein the third semiconductor fin is lengthwise parallel to the first and the second semiconductor fins, wherein a side of the third gate structure is substantially aligned with an end of the third semiconductor fin and a side of the fourth gate structure is substantially aligned with another end of the third semiconductor fin from a top view.

In another example aspect, the present disclosure is directed to a semiconductor structure that includes a substrate and first and second semiconductor fins extending from the substrate. The first and the second semiconductor fins are lengthwise aligned along a first direction, and a first end of the first semiconductor fin faces a second end of the second semiconductor fin. The semiconductor structure further includes a first isolation structure over the substrate and adjacent to sidewalls of the first and the second semiconductor fins and first and second gate structures that are oriented lengthwise along a second direction generally perpendicular to the first direction. The first and the second gate structures are disposed over the first isolation structure, the first gate structure is disposed over the first semiconductor fin, and the second gate structure is disposed over the second semiconductor fin. The semiconductor structure further includes a second isolation structure extending from the first end of the first semiconductor fin to the second end of the second semiconductor fin, wherein the first and the second isolation structures include different dielectric materials.

In an embodiment of the semiconductor structure, a side of the first gate structure is substantially aligned with the first end of the first semiconductor fin and a side of the second gate structure is substantially aligned with the second end of the second semiconductor fin from a top view. In another embodiment, the second isolation structure includes a portion of a spacer layer that extends continuously through a trench between the first end of the first semiconductor fin and the second end of the second semiconductor fin, wherein the spacer layer is further disposed over a sidewall of the first gate structure and over a sidewall of the second gate structure.

In some embodiments of the semiconductor structure, the second isolation structure includes a portion of an inter-layer dielectric layer, wherein the inter-layer dielectric layer is further disposed over the first and the second gate structures. In some embodiments, the semiconductor structure further includes a spacer layer disposed over a sidewall of the first gate structure and over a sidewall of the second gate structure, wherein the first end of the first semiconductor fin and the second end of the second semiconductor fin are directly under the spacer layer.

In yet another example aspect, the present disclosure is directed to a method that includes providing a structure having a substrate, a semiconductor fin extending from the substrate, an isolation structure over the substrate and adjacent to sidewalls of the semiconductor fin, and two gate structures over the isolation structure and over the semiconductor fin, wherein a segment of the semiconductor fin is disposed between the two gate structures. The method further includes forming an etch mask that exposes the segment of the semiconductor fin and portions of the isolation structure and the two gate structures that are adjacent to the segment of the semiconductor fin; etching the segment of the semiconductor fin through the etch mask to form a first trench; forming a spacer layer on sidewalls of the two gate structures and within the first trench; and forming an inter-layer dielectric (ILD) layer over the gate structures and over the spacer layer, wherein a portion of the ILD layer is within the first trench.

In some embodiment, after the forming of the spacer layer and before the forming of the ILD layer, the method further includes etching the semiconductor fin adjacent to the two gate structures to form two source/drain trenches, wherein each of the two gate structures is disposed between one of the two source/drain trenches and the first trench; and epitaxially growing source/drain features in the two source/drain trenches. In some embodiment, the method further includes replacing the two gate structures with two high-k metal gates. In some embodiments of the method, the first trench extends below a bottom surface of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate;
first and second semiconductor fins extending from the substrate, wherein the first and the second semiconductor fins are lengthwise aligned along a first direction;
an isolation structure over the substrate and adjacent to sidewalls of the first and the second semiconductor fins;
first and second gate structures that are oriented lengthwise along a second direction generally perpendicular to the first direction, wherein the first and the second gate structures are disposed over the isolation structure, the first gate structure is disposed over the first semiconductor fin, and the second gate structure is disposed over the second semiconductor fin; and
a spacer layer that is disposed on a sidewall of the first gate structure and on a sidewall of the second gate structure and extends continuously through a trench between an end of the first semiconductor fin and an end of the second semiconductor fin.
2. The semiconductor structure of claim 1, wherein the trench is substantially rectangular from a top view, and the end of the first semiconductor fin and the end of the second semiconductor fin form at least portions of two opposing sidewalls of the trench.

3. The semiconductor structure of claim 2, wherein the spacer layer is disposed over the two opposing sidewalls of the trench and at bottom of the trench.

4. The semiconductor structure of claim 2, wherein sidewalls of the isolation structure form at least portions of other two opposing sidewalls of the trench.

5. The semiconductor structure of claim 1, wherein a top surface of a portion of the spacer layer within the trench is below a top surface of the isolation structure.

6. The semiconductor structure of claim 1, wherein a portion of the spacer layer within the trench extends below a top surface of the substrate.

7. The semiconductor structure of claim 1, wherein a side of the first gate structure is substantially aligned with the end of the first semiconductor fin from a top view.

8. The semiconductor structure of claim 7, wherein a side of the second gate structure is substantially aligned with the end of the second semiconductor fin from a top view.

9. The semiconductor structure of claim 1, further comprising:
an inter-layer dielectric layer that is disposed over the first and the second gate structures and fills in a portion of the trench.

10. The semiconductor structure of claim 1, further comprising:
third and fourth gate structures that are parallel to each other and oriented lengthwise along the second direction, wherein the third and the fourth gate structures are disposed over the isolation structure, the third gate structure is disposed over a channel region of the first semiconductor fin, and the fourth gate structure is disposed over a channel region of the second semiconductor fin.

11. The semiconductor structure of claim 10, further comprising:
a third semiconductor fin extending from the substrate, wherein the third semiconductor fin is lengthwise parallel to the first and the second semiconductor fins, wherein a side of the third gate structure is substantially aligned with an end of the third semiconductor fin and a side of the fourth gate structure is substantially aligned with another end of the third semiconductor fin from a top view.

12. A semiconductor structure, comprising:
a substrate;
first and second semiconductor fins extending from the substrate, wherein the first and the second semiconductor fins are lengthwise aligned along a first direction, and a first end of the first semiconductor fin faces a second end of the second semiconductor fin;
a first isolation structure over the substrate and adjacent to sidewalls of the first and the second semiconductor fins;
first and second gate structures that are oriented lengthwise along a second direction generally perpendicular to the first direction, wherein the first and the second gate structures are disposed over the first isolation structure, the first gate structure is disposed over the first semiconductor fin, and the second gate structure is disposed over the second semiconductor fin; and
a second isolation structure extending from the first end of the first semiconductor fin to the second end of the second semiconductor fin, wherein the first and the second isolation structures include different dielectric materials.

13. The semiconductor structure of claim 12, wherein a side of the first gate structure is substantially aligned with the first end of the first semiconductor fin and a side of the second gate structure is substantially aligned with the second end of the second semiconductor fin from a top view.

14. The semiconductor structure of claim 12, wherein the second isolation structure includes a portion of a spacer layer that extends continuously through a trench between the first end of the first semiconductor fin and the second end of the second semiconductor fin, wherein the spacer layer is further disposed over a sidewall of the first gate structure and over a sidewall of the second gate structure.

15. The semiconductor structure of claim 12, wherein the second isolation structure includes a portion of an inter-layer dielectric layer, wherein the inter-layer dielectric layer is further disposed over the first and the second gate structures.

16. The semiconductor structure of claim 12, further comprising a spacer layer disposed over a sidewall of the first gate structure and over a sidewall of the second gate structure, wherein the first end of the first semiconductor fin and the second end of the second semiconductor fin are directly under the spacer layer.

17. A semiconductor structure, comprising:
a substrate;
first and second semiconductor fins over the substrate and extending lengthwise aligned along a first direction from a top view;
an isolation structure over the substrate and adjacent to the first and the second semiconductor fins;
first and second gate structures extending lengthwise generally along a second direction perpendicular to the first direction, wherein the first gate structure is disposed over both the isolation structure and the first semiconductor fin, and the second gate structure is disposed over both the isolation structure and the second semiconductor fin; and
a spacer layer disposed on a sidewall of the first gate structure, a sidewall of the second gate structure, a vertical end of the first semiconductor fin, a vertical end of the second semiconductor fin, and a top surface of the substrate.

18. The semiconductor structure of claim 17, wherein the spacer layer is also disposed on two vertical surfaces of the isolation structure.

19. The semiconductor structure of claim 17, further comprising:
an inter-layer dielectric layer, wherein a portion of the inter-layer dielectric layer is in direct contact with the spacer layer and extends below a top surface of the first semiconductor fin.

20. The semiconductor structure of claim 17, wherein a bottom surface of the spacer layer is below a topmost surface of the substrate.

* * * * *